(12) United States Patent
Lazzarino et al.

(10) Patent No.: US 10,770,295 B2
(45) Date of Patent: Sep. 8, 2020

(54) PATTERNING METHOD

(71) Applicant: IMEC VZW, Leuven (BE)

(72) Inventors: Frederic Lazzarino, Hamme-Mille (BE); Victor M. Blanco, Leefdaal (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/556,124

(22) Filed: Aug. 29, 2019

(65) Prior Publication Data

US 2020/0075335 A1 Mar. 5, 2020

(30) Foreign Application Priority Data

Aug. 30, 2018 (EP) ..................................... 18191776

(51) Int. Cl.
*H01L 21/033* (2006.01)
*H01L 21/311* (2006.01)

(52) U.S. Cl.
CPC .... *H01L 21/0337* (2013.01); *H01L 21/31144* (2013.01)

(58) Field of Classification Search
CPC ........... H01L 21/0337; H01L 21/31144; H01L 21/76816; H01L 21/0273; H01L 21/3081; G03F 7/16; G03F 7/70733
See application file for complete search history.

(56) References Cited

U.S. PATENT DOCUMENTS

| | | | |
|---|---|---|---|
| 9,177,792 B2 | 11/2015 | Chang et al. | |
| 9,466,486 B2 | 10/2016 | Shieh et al. | |
| 9,679,809 B1 | 6/2017 | Kye et al. | |
| 9,786,545 B1 * | 10/2017 | Bouche | H01L 21/76816 |
| 9,812,351 B1 | 11/2017 | Licausi et al. | |
| 9,818,623 B2 | 11/2017 | Stephens et al. | |
| 9,852,986 B1 | 12/2017 | Stephens et al. | |
| 9,941,164 B1 * | 4/2018 | Kim | H01L 21/3083 |
| 2015/0200096 A1 | 7/2015 | Huang et al. | |
| 2018/0114721 A1 * | 4/2018 | Mohanty | H01L 21/31144 |

FOREIGN PATENT DOCUMENTS

| | | |
|---|---|---|
| EP | 3255663 A1 | 12/2017 |
| WO | 2017/083528 A1 | 5/2017 |

OTHER PUBLICATIONS

European Search Report, European Patent Application No. 18191776.6, dated Feb. 27, 2019, 5 pages.

* cited by examiner

*Primary Examiner* — Mohammed R Alam
(74) *Attorney, Agent, or Firm* — McDonnell Boehnen Hulbert & Berghoff LLP

(57) ABSTRACT

An example embodiment includes a patterning method comprising: forming a layer stack comprising a target layer, a lower memorization layer and an upper memorization layer, forming above the upper memorization layer a first mask layer, patterning a set of upper trenches in the upper memorization layer, forming a first block pattern, the first block pattern comprising a set of first blocks, patterning a first set of lower trenches in the lower memorization layer, patterning the patterned upper memorization layer to form a second block pattern comprising a set of second blocks, forming above the patterned lower memorization layer and the second block pattern a second mask layer, patterning a second set of lower trenches in the patterned lower memorization layer, the patterning comprising using the second mask layer, the spacer layer and the second block pattern as an etch mask.

15 Claims, 13 Drawing Sheets

PATTERNING METHOD

CROSS-REFERENCE TO RELATED APPLICATIONS

The present application is a non-provisional patent application claiming priority to European Patent Application No. 18191776.6, filed on Aug. 30, 2018, the contents of which are hereby incorporated by reference.

FIELD OF THE DISCLOSURE

The present disclosure relates to a patterning method.

BACKGROUND

Semiconductor device fabrication of today frequently involves forming of various patterns, such as lines or trenches in a layer, for instance in a hard mask layer, a dielectric layer, a metal layer or a semiconductor layer.

In lithographically based patterning techniques (i.e. "litho-etch"), a photoresist layer may be formed above the layer which is to be patterned. The photoresist layer may be lithographically patterned (i.e. exposed and developed) and the pattern in the photoresist layer may then be transferred into the underlying layer by etching while using the patterned photoresist layer as an etch mask. Lithographically based patterning techniques may also involve transferring the pattern in the photoresist layer into a mask layer (typically a hard mask layer) in one or more etching steps, and thereafter using the mask layer in a final pattern transfer step into an underlying layer.

In spacer-assisted multiple patterning techniques (also known as self-aligned multiple patterning techniques) such as SADP or SAQP, grating-like patterning layers of mandrel lines and spacer lines may be used to form tight pitch line patterns in an underlying layer. Multiple patterning may be combined with block techniques to enable forming of interrupted or discontinuous lines.

The minimum critical dimensions (CDs) of litho-etch based patterning is limited by among others the wavelength of the light used for exposing photoresist. Although extreme ultraviolet lithography (EUVL) enables forming patterns with reduced CDs compared to current technologies based on for instance 193i, edge placement errors (EPE) still imposes a limit on the minimum attainable CD. Meanwhile, SADP and SAQP enables forming of comparably tighter pitch patterns. However, while lithographically based patterning techniques allows forming of patterns of various shapes, self-aligned multiple patterning techniques are typically limited to forming regular and repeating line-based patterns.

SUMMARY

In light of the above, there is in accordance with an aspect of the present disclosure provided a patterning method comprising: forming a layer stack comprising in a bottom-up direction a target layer, a lower memorization layer and an upper memorization layer, forming above the upper memorization layer a first mask layer, wherein a set of trenches are formed in the first temporary mask layer using lithography and etching, patterning a set of upper trenches in the upper memorization layer, the patterning comprising using the first mask layer as an etch mask, forming a spacer layer on sidewalls of the upper trenches, forming a first block pattern, the first block pattern comprising a set of first blocks, each first block extending across an upper trench in the upper memorization layer, patterning a first set of lower trenches in the lower memorization layer, the patterning comprising using the patterned upper memorization layer, the spacer layer and the first block pattern as an etch mask, wherein at least a subset of the first lower trenches are interrupted by a trench interruption, each trench interruption being formed by a portion of the lower memorization layer preserved under a respective one of the first blocks, patterning the patterned upper memorization layer to form a second block pattern comprising a set of second blocks, each second block being formed of a respective remaining portion of the upper memorization layer, forming above the patterned lower memorization layer and the second block pattern a second mask layer, wherein a set of trenches are formed in the second mask layer using lithography and etching, wherein each trench of the set of trenches is formed over a respective remaining portion of the patterned lower memorization layer, patterning a second set of lower trenches in the patterned lower memorization layer, the patterning comprising using the second mask layer, the spacer layer and the second block pattern as an etch mask, wherein at least a subset of the second lower trenches are interrupted by a trench interruption, each trench interruption being formed by a portion of the lower memorization layer preserved under a respective one of the second blocks, and wherein the method further comprises patterning in the target layer a first set of target trenches under the first set of lower trenches and a second set of target trenches under the second set of lower trenches.

The disclosed method enables an increased flexibility for the shape of the patterns than provided by conventional self-aligned multiple patterning techniques. Additionally, the method enabling forming of patterns with smaller CD than provided by conventional lithographical patterning techniques.

The disclosed method is based on a combination of two litho-etch (LE) patterning processes supplemented with a spacer-assisted (SA) technique. The method may hence be referred to as a "SALELE" patterning process.

Employing two LE processes, allows comparably tight pitch patterns to be formed by combining two relaxed pitch patterns. This may be particularly beneficial if the trenches in the first mask layer are formed using EUVL which otherwise is a technique prone to stochastic failures if used to directly form aggressively scaled patterns. Relaxed printing may provide corresponding benefits also in 193i applications.

Since the trenches in the first and second mask layers are formed by LE, the trench patterns may be designed in a relatively free manner. For instance, the trenches may be formed with various widths, various spacing and various directions in different regions of the first mask layer, rather than in a regular, fixed single pitch trench pattern. A further benefit over self-aligned multiple patterning techniques is that formation of dummy lines may be avoided.

The disclosed method is enabled by the combined use an upper and lower memorization layer. The upper memorization layer has a double function. The upper memorization layer is first patterned to memorize the pattern of upper trenches, which pattern later is used for patterning the lower memorization layer. The (patterned) upper memorization layer is then again patterned to memorize the second block pattern, which is used to define trench interruptions for the second set of lower trenches in the lower memorization layer. Meanwhile, the lower memorization layer allows the first set of lower trenches and the second set of lower trenches to be sequentially memorized therein, prior to patterning the target layer.

By forming the spacer layer on the sidewalls of the upper trenches in the upper memorization layer, spacer lines may be defined along the sidewalls of each upper trench. Using the spacer layer/spacer lines as an etch mask in subsequent patterning steps makes it possible to ensure an at least minimum separation between adjacent trenches which are to be formed in the target layer. A sidewall spacer layer may be reliably formed with uniform thickness in the upper trenches and may hence reduce process variability.

Meanwhile, the first and second block patterns enable forming of interrupted trenches with smaller tip-to-tip separation than would be achievable by directly patterning interrupted trenches in the first and second mask layers. Since the second block pattern is formed by patterning the already once patterned upper memorization layer, the second block pattern may be self-aligned with respect to the first set of lower trenches and consequently reliably be aligned with the second set of lower trenches.

By a first feature such as a layer, a mask or other structure, being formed "above" a second feature such as a layer, a mask or other structure, is hereby meant that the first feature is formed above the second feature (as seen) in a normal direction to the main surface or in-plane extension of the feature, e.g. layer or level, or in the normal direction to the target layer. If the layer stack is formed above a substrate, above may accordingly refer to the normal direction to the substrate.

A first feature such as a layer, a mask or other structure, formed "on" a second feature such as a layer, a mask or other structure, may either be formed directly on the second feature (i.e. in abutment with the second feature), or indirectly on the second feature, with one or more structures intermediate the first and the second feature (i.e. not in direct contact with the first feature).

By a "trench" in a layer (e.g. in a mask/memorization/target layer) is hereby meant a recess or opening in the layer. A trench may, at least along a portion thereof, extend in a straight line and present a uniform width.

By the terminology "using a layer as an etch mask" is hereby meant that one or more underlying layers are etched while the layer counteracts etching of the underlying layer(s) in regions covered by the layer. The underlying layer(s) are hence etched selectively to the layer acting as an etch mask.

By etching or removal of a feature "A", selectively to a feature "B", is hereby meant that a feature A arranged adjacent to a feature B may be removed while preserving the feature B. This may be achieved by selecting a material of feature A and a material of feature B as a combination of materials presenting different etch rates in a given etch process. The preservation of the feature B following the etch process may be complete (in the sense that the feature B is not affected appreciably during the etch process) or at least partial (in the sense that the feature B remains at least to the extent that it may serve its intended function during subsequent process steps). A ratio of an etch rate of the material of feature A compared to an etch rate of the material of feature B may be 2:1 or higher, 10:1 or higher, or even 40:1 or higher.

The patterning of the first set of target trenches may be performed prior to patterning of the second set of target trenches. More specifically, the patterning of the first set of target trenches may comprise using the once patterned lower memorization layer and the spacer layer as an etch mask. Subsequently, the patterning of the second set of target trenches may comprise using the twice patterned lower memorization layer as an etch mask. Thereby, the first and second sets of target trenches may be formed in different and subsequent patterning steps.

This sequential patterning approach simplifies the process since it does not require the patterning of the second block pattern in the patterned upper memorization layer to employ an etch with a considerably greater selectivity towards the material of the upper memorization layer than of the target layer. Moreover, forming the first and second sets of target trenches simultaneously may complicate the target layer patterning since the regions of the target layer exposed in, respectively, the first and second lower sets of trenches of the lower memorization layer then would have been exposed to different etching processes, modifying the respective surface regions of the target layer differently. Differently modified surface regions may respond differently to etching during the patterning of the target layer and in turn have an adverse impact on the fidelity of the target layer patterning.

The first set of target trenches may be formed during the patterning of the second block pattern in the once patterned upper memorization layer and prior to forming the second mask layer.

Postponing patterning of the first set of target trenches until forming the second block pattern makes it possible to preserve the mask budget of the (once) patterned upper memorization layer for the second block pattern. More specifically, a second block mask comprising a set of second mask blocks may counteract etching of the portions of the once patterned upper memorization layer (which portions are to form the second blocks of the second block pattern). The etching employed during the patterning of the first set of target trenches could otherwise attack also these portions of the patterned upper memorization layer.

According to an embodiment, trenches of at least a subset of the second set of lower trenches are arranged alternatingly with trenches of at least a subset of the first set of lower trenches. Hence, the subsets of first lower trenches and second lower trenches may together define a tight pitch trench pattern.

The spacer layer may define first and second spacer lines along each upper trench. Accordingly, each trench of the at least a subset of the second set of lower trenches may be spaced from an adjacent trench of the at least a subset of the first set of lower trenches by a thickness portion of the lower memorization layer preserved under a respective one of the spacer lines a respective one of the spacer lines. Thereby, the subsets of first and second trenches may be formed with a uniform spacing matching a line width of the spacer lines (i.e. the thickness of the spacer layer).

According to an embodiment, forming the set of trenches in the first mask layer comprises: forming a photoresist layer above the first mask layer and lithographically patterning a set of trenches in the photoresist layer, and patterning the set of trenches in the first mask layer, the patterning comprising using the patterned photoresist layer as an etch mask.

Accordingly, a trench pattern may first be lithographically defined in the photoresist layer and subsequently trenches may be patterned in the first mask layer.

The patterning of the set of trenches in the first mask layer may comprise transferring the set of trenches in the photoresist layer into the first mask layer by etching, thereby forming the set of trenches in the first mask layer.

The patterning of the set of trenches may however also comprise a sequential transferring of trench patterns:

A transfer layer may be formed above the first mask layer. The first photoresist layer may be formed above the transfer layer. The patterning of the set of trenches in the first mask layer may comprise: transferring the set of trenches in the photoresist layer into the transfer layer by etching, thereby forming a set of trenches in the transfer layer, subjecting the patterned transfer layer to an etch step thereby forming a trimmed trench pattern in the transfer layer, and thereafter transferring the trimmed trench pattern into the first mask layer by etching, thereby forming the set of trenches in the first mask layer.

Hence, the trench pattern formed in the first mask layer may be trimmed in relation to the original lithographically patterned trench pattern in the photoresist layer. The trimming may comprise a lateral etch back of the portions of the patterned transfer layer surrounding the trenches formed therein. In other words, the trimming may result in a widening of the trenches in the patterned transfer layer.

Subsequent to the transfer of the trimmed trench pattern into the first mask layer, the first mask layer may be used as an etch mask in the patterning of the upper trenches in the upper memorization layer.

According to an alternative, the method may comprise subjecting the patterned upper memorization layer (with the upper trenches formed therein) to a trimming step, thereby forming a trimmed trench pattern in the upper memorization layer. The trimming may comprise an etch step. The trimming may comprise an oxidation of an outer thickness portion of the upper memorization layer to form an oxide layer on the upper memorization layer and subsequently removing the oxide layer formed on the upper memorization layer by etching.

According to an embodiment, the second mask layer is formed to cover the patterned lower memorization layer and the second block pattern, and wherein forming the set of trenches in the second mask layer comprises: forming a photoresist layer above the second mask layer and lithographically patterning a set of trenches in the photoresist layer, and patterning the set of trenches in the second mask layer, the patterning comprising using the patterned photoresist layer as an etch mask.

Accordingly, a trench pattern may first be lithographically defined in the photoresist layer and subsequently trenches may be patterned in the second mask layer.

The patterning of the set of trenches in the second mask layer may comprise transferring the set of trenches in the photoresist layer into the second mask layer by etching, thereby forming the set of trenches in the second mask layer.

The patterning of the set of trenches may however also comprise a sequential transferring of trench patterns:

A transfer layer may be formed above the second mask layer. The second photoresist layer may be formed above the transfer layer. The patterning of the set of trenches in the second mask layer may comprise: transferring the set of trenches in the second photoresist layer into the transfer layer by etching, thereby forming a set of trenches in the transfer layer, and thereafter transferring the set of trenches in the transfer layer into the second mask layer by etching, thereby forming the set of trenches in the second mask layer.

Subsequent to the transfer of the trench pattern into the second mask layer, the second mask layer may be used as an etch mask in the patterning of the second set of lower trenches in the lower memorization layer.

According to an embodiment, forming the first block pattern comprises: forming a first block mask layer covering the patterned upper memorization layer, forming a photoresist layer above the first block mask layer and lithographically patterning the photoresist layer to define a photoresist block mask comprising a set of resist blocks, each resist block extending across an upper trench in the upper memorization layer, and patterning the first block mask layer to form the second block pattern, the patterning comprising using the photoresist block mask as an etch mask.

Accordingly, blocks may first be lithographically defined in the photoresist layer and subsequently the first block pattern may be patterned in the first block mask layer.

According to an embodiment, patterning the patterned upper memorization layer to form a second block pattern comprises: forming a second block mask layer covering the patterned lower and upper memorization layers, forming a photoresist layer above the second block mask layer and lithographically patterning the photoresist layer to define a photoresist block mask comprising a set of resist blocks, each resist block being formed over a respective remaining portion of the upper memorization layer, patterning the second block mask layer to form a second block mask comprising a set of second mask blocks, the patterning comprising using the photoresist block mask as an etch mask, and patterning the patterned upper memorization layer to form the second block pattern, the patterning comprising using the second block mask as an etch mask.

Depositing a second block mask layer covering the patterned lower and upper memorization layers allows providing a planar surface, thus facilitating a lithographic patterning of a block pattern in the photoresist layer.

The patterning of the second block mask layer may comprise etching the second block mask layer to form the second block mask comprising the set of second mask blocks and such that portions of the second block mask layer remain in the first set of lower trenches, wherein during the patterning of the patterned upper memorization layer to form the second block pattern, the portions of the second block mask layer remaining in the first set of lower trenches masks the target layer within the first set of lower trenches, and wherein the method further comprises: removing the second block mask and the portions of the second block mask layer subsequent to forming the second block pattern.

By patterning the second block mask layer such that portions of the block mask layer are preserved in the first set of lower trenches, an upper surface of the target layer may be covered during the patterning of the patterning to form the second block pattern (i.e. the patterning of the patterned upper memorization layer). Thus during the patterning to form the second block pattern, etching of the target layer may be counteracted by the portions of the block mask layer remaining within the first set of lower trenches and by the (once) patterned lower memorization layer outside of the first set of lower trenches. This allows limiting exposure of the target layer to etchants prior to patterning of the target layer. This in turn facilitates a simultaneous patterning of the first and second sets of target trenches.

Accordingly, the method may comprise patterning the first set of target trenches and the second set of target trenches simultaneously, the patterning comprising using the (twice) patterned lower memorization layer (comprising the first and second lower sets of trenches) as an etch mask. Thereby, the first and second sets of target trenches may be formed simultaneously in a same patterning step.

The target layer may be a hard mask layer. The method may accordingly be used for the purpose of patterning a hard mask layer, which in turn may be used for patterning an underlying layer.

According to one combination, the target layer may be a TiN layer, the lower memorization layer may be a SiN layer and the upper memorization layer may be an a-Si (amorphous silicon) layer.

More specifically, the first and second set target trenches may be transferred into an underlying layer using the target layer as an etch mask.

The underlying layer may be a dielectric layer. Accordingly the method may be used for forming trenches in a dielectric layer, which subsequently may be filled with a conductive material to form a pattern of conductive paths of an interconnect structure. As the method makes it possible to avoid forming of dummy trenches in the target layer and dielectric layer, it follows that unused conductive dummy lines may be avoided in the dielectric layer. Such dummy lines could otherwise adversely affect RC delay and/or power consumption in a final circuit.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A method for patterning a target layer will now be described with reference to FIGS. 1-21. The method will be described in connection with patterning a target layer 22 in the form of a hard mask layer, which in turn may be used for the purpose of patterning trenches in a dielectric layer stack 10. It is however noted that the method has a more general applicability for patterning trenches in any target layer, such as in a semiconductor a layer or a metal layer.

Figure 1:
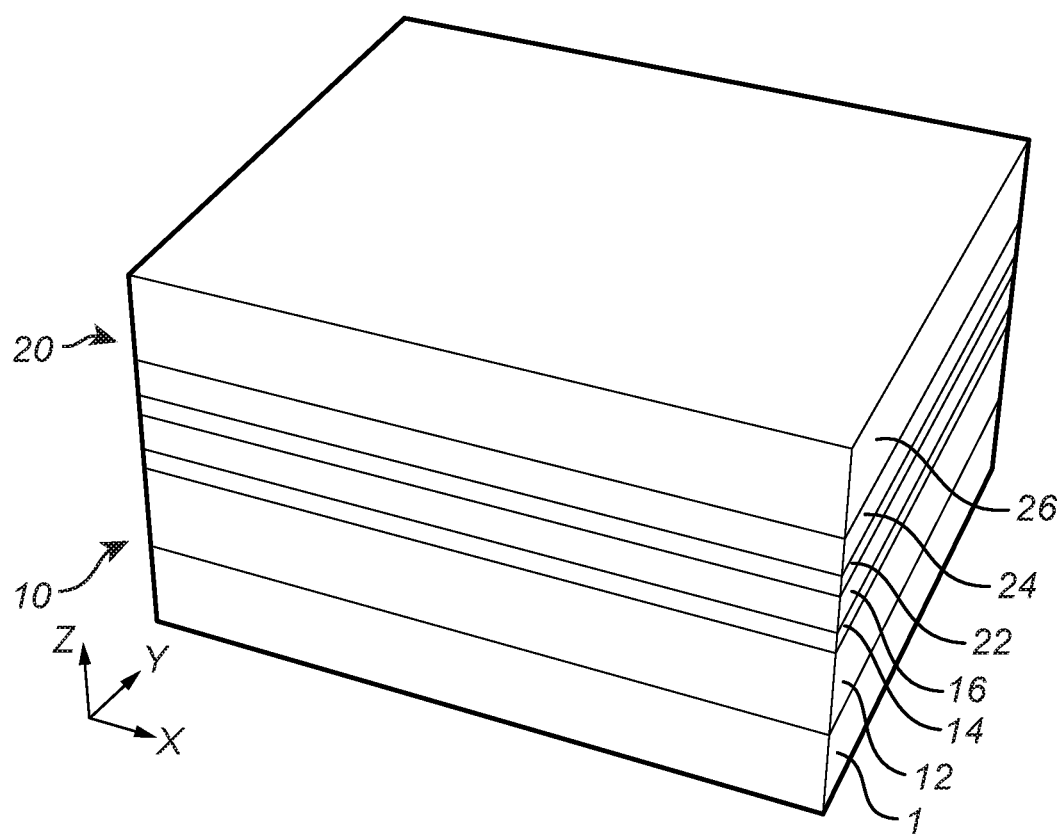
FIG. 1 illustrates a section of a semiconductor structure, according to an example embodiment.

With reference to FIG. 1 there is shown, in perspective, a section of a semiconductor structure or intermediate device. The structure may extend laterally or horizontally beyond the illustrated section. The illustrated planes of section extending through the structure are common to all the figures unless stated otherwise. It is noted that the relative dimensions of the shown elements, in particular the relative thickness of the layers, is merely schematic and may, for the purpose of illustrational clarity, differ from a physical structure. In FIG. 1, directions X and Y indicates a first and a second horizontal direction, respectively, (parallel to the main plane of extension of the layers) and Z indicates a vertical direction (normal to the main surface of the layers).

The structure includes in a bottom-up direction a substrate 1, for instance a semiconductor substrate. An active device layer including semiconductor devices such as transistors may be fabricated on a main surface of the substrate 1. The active device layer may also be referred to as a front-end-of-line portion (FEOL-portion).

A dielectric layer stack 10 is formed above the substrate 1. The dielectric layer stack 10 may comprise a low-k dielectric layer 12, an interface layer 14 and an oxide capping layer 16. More generally, the dielectric layer stack 10 may be of any conventional type used in back-end-of-line (BEOL) interconnect structures.

A layer stack 20 is formed above the dielectric layer stack 10. The layer stack 20 comprises in a bottom-up direction (i.e. parallel to the vertical direction Z) a target layer 22, a lower memorization layer 24 and an upper memorization layer 26. As may be understood from the following, the memorization layers 24, 26 may through patterning be used to "memorize" or "store" one or more parts of a final pattern that is to be transferred to the target layer. Alternatively, the lower and upper memorization layers 24, 26 may be referred to as the lower and upper patterning layers 24, 26. The target layer 22 may be a TiN layer. The lower memorization layer 24 may be a SiN layer. The upper memorization layer 26 may be an a-Si layer. However, other material combinations allowing etching of each one of the layers 22, 24, 26 of the stack 20, selective to the other two layers of the stack 20 may also be used. More generally, the target layer may be formed of a first material. The lower memorization layer may be formed of a second material different from the first material. The upper memorization layer may be formed of a third material different from the first material and the third material.

FIGS. 2-5 illustrate process steps for forming a first mask layer 31 and forming a set of trenches 40 therein using lithography and etching.

Figure 2:
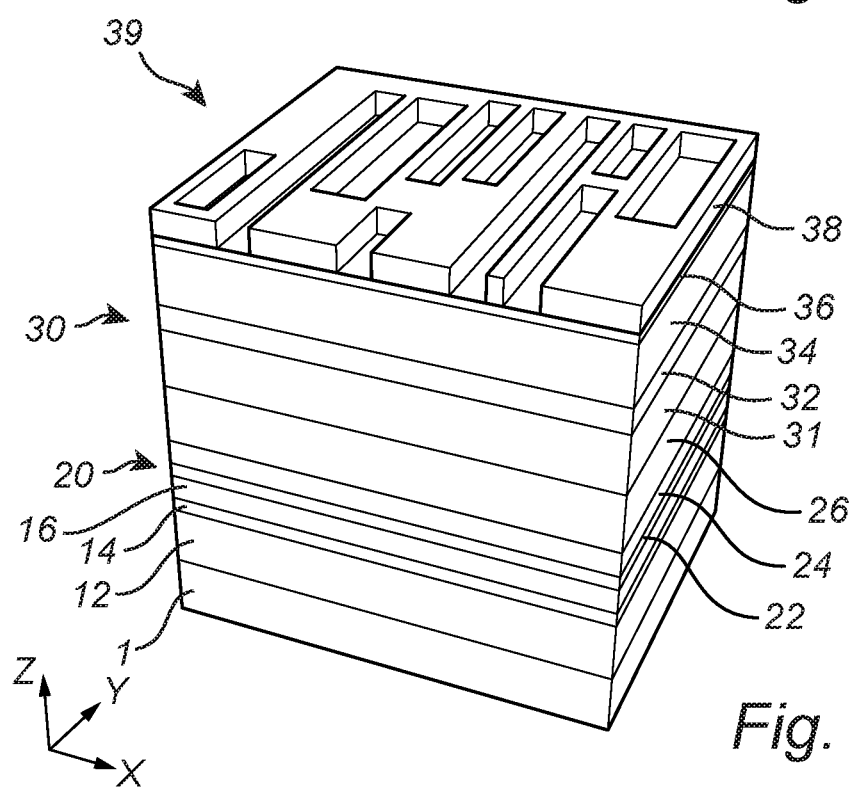
FIG. 2 illustrates a process step for forming a first mask layer and forming a set of trenches therein using lithography and etching, according to an example embodiment.

In FIG. 2 a first lithographic layer stack 30 has been formed on the layer stack 20. The lithographic layer stack 30 comprises the first mask layer 31 and a photoresist layer 38. The first mask layer 31 may for instance be formed by a carbon-based patterning film, for instance an amorphous carbon film, or some other conventional organic or non-organic patterning film allowing high-fidelity pattern transfer when used in a lithographic layer stack. As shown, the layer stack 30 may additionally comprise one or more transfer layers 32, 34, 36 intermediate the first mask layer 31 and the photoresist layer 38. The layer stack 30 may comprise an anti-reflective coating 32, for instance in the form of a silicon-including layer such as SiOC. The layer stack 30 may comprise an organic spin-on layer 34, such as a spin-on-carbon (SOC) layer. The layer stack may further comprise an additional anti-reflective coating 36, for instance in the form of a spin-on-glass (SOG) layer or a silicon-including layer.

A trench pattern comprising a set of trenches 39 have been lithographically patterned in the photoresist layer 38. Each trench of the set of trenches 39 is formed over a region of the target layer 22 where a trench of a first set of target trenches 100 is to be formed. As shown, the trenches 39 may be formed with various widths (along the first horizontal direction X) and various longitudinal dimensions (along the second horizontal direction Y). The trenches 39 may extend in parallel to each other.

Figure 3:
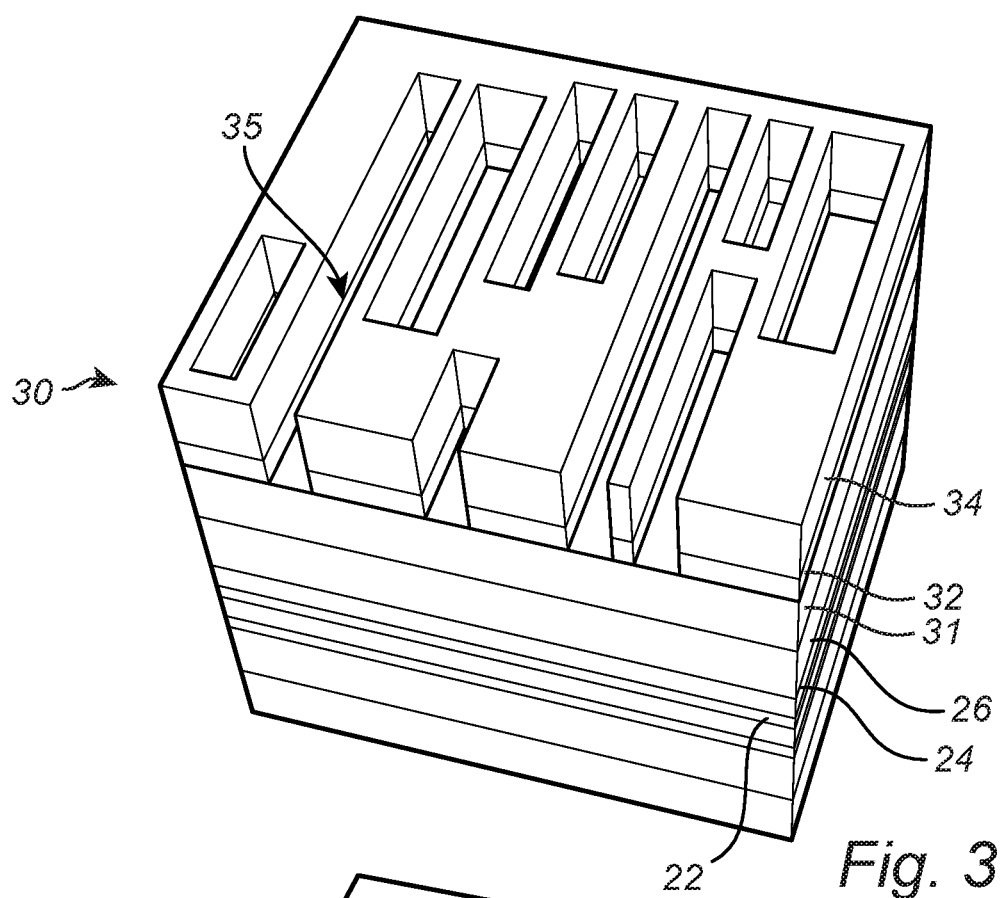
FIG. 3 illustrates a process step for forming a first mask layer and forming a set of trenches therein using lithography and etching, according to an example embodiment.

In FIG. 3 the trench pattern comprising the set of trenches 39 have been transferred into the transfer layers 32 and 34 to form a set of trenches 35 therein. The pattern transfer may comprise first transferring the trench pattern comprising the set of trenches 39 into the transfer layer 36 by etching the layer 36 while using the photoresist layer 38 as an etch mask. The transfer layer 34 may then be etched through the trenches in the transfer layer 36. If the transfer layer 34 is formed by an organic material (such as a SOC), the photoresist layer 38 may be consumed during the etching. Thus, mainly the transfer layer 36 may act as an etch mask during the patterning of the transfer layer 34. The trenches 35 in the transfer layer 34 may then be further transferred into the transfer layer 32 by etching. During the etching the transfer layer 36 may be consumed. Thus, mainly the transfer layer 34 may act as an etch mask during the patterning of the transfer layer 32.

Figure 4:
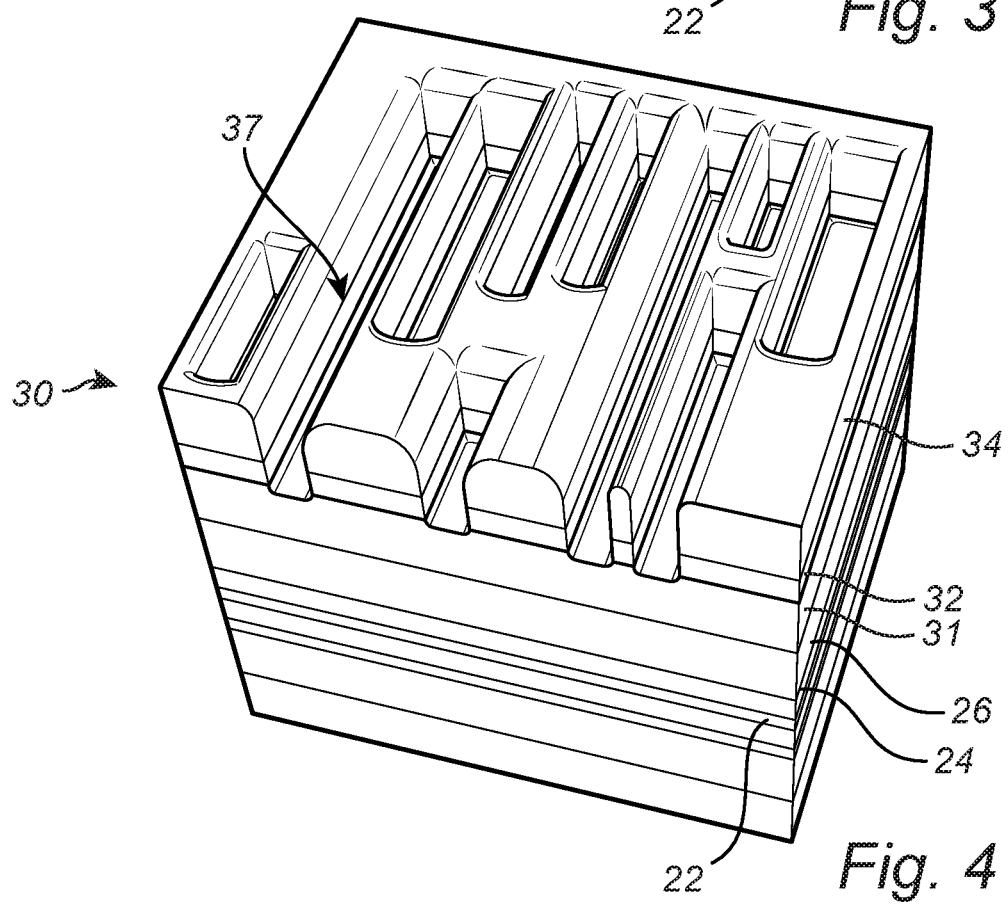
FIG. 4 illustrates a process step for forming a first mask layer and forming a set of trenches therein using lithography and etching, according to an example embodiment.

FIG. 4 illustrates an optional trimming step which may be performed prior to patterning the first mask layer 31. The patterned transfer layers 32, 34 may be subjected to a short isotropic etch step, trimming the lateral dimensions of the layers 32, 34 thus forming a trimmed trench pattern 37. By trimming the lateral dimensions of the layers 32, 34 (i.e. along the horizontal plane defined by the X and Y directions) the critical dimensions of the lithographically defined trench pattern may be reduced to the desired values prior to patterning the upper memorization layer 26. Consequently, the trimming results in increasing the widths of the trenches 35 to form the widened trenches 37 in the transfer layers 32, 34.

Figure 5:
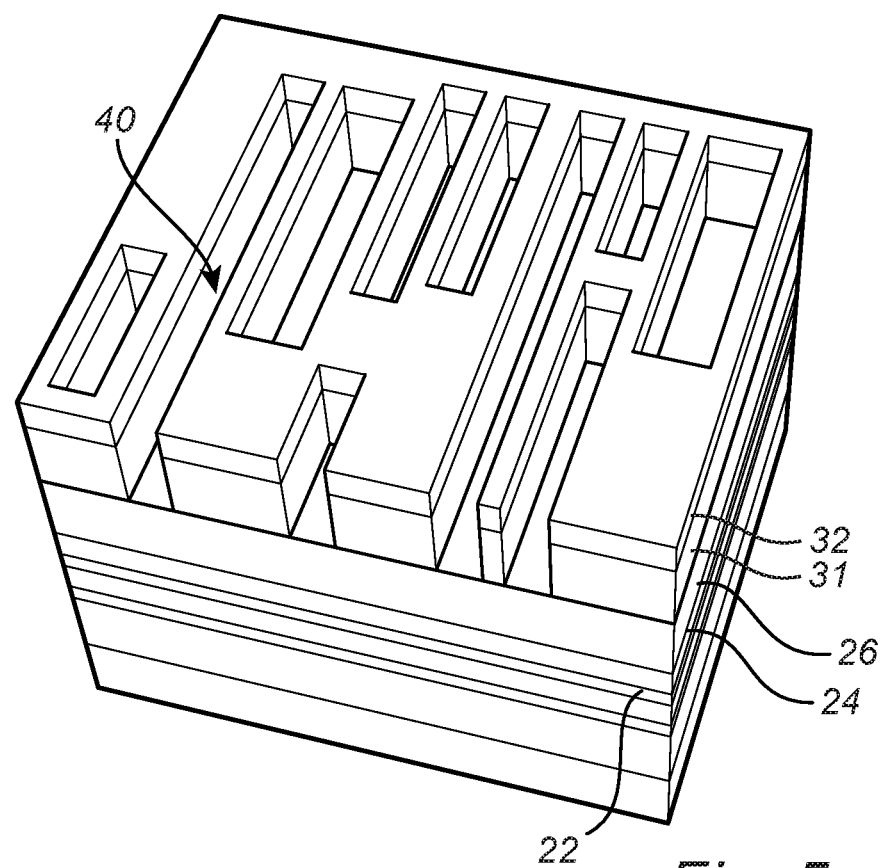
FIG. 5 illustrates a process step for forming a first mask layer and forming a set of trenches therein using lithography and etching, according to an example embodiment.

In FIG. 5, the trimmed trench pattern 37 has been transferred into the first mask layer 31 to form a pattern comprising a set of trenches 40. The set of trenches 40 extend in parallel to each other. The set of trenches 40 exposes an upper surface of the upper memorization layer 26. The set of trenches 40 may be formed by etching the first mask layer 31 while using at least the transfer layer 32, possibly also the transfer layer 34 (depending on etch selectivities), as an etch mask.

In an alternative approach, the lithographic layer stack 30 may comprise only the first mask layer 31 and the photoresist layer 38. The set of trenches 39 may be lithographically patterned in the photoresist layer 38. The set of trenches 40 may subsequently be patterned in the first mask layer 31 using the patterned photoresist layer 38 as an etch mask.

In any case, the various steps of patterning the layer stack 30 may use conventional etching techniques. For instance, a SOG or SiOC layer may be etched using fluorine based etching chemistries (e.g. $CF_4$, $CH_3F$, $CHF_3$, $CH_2F_2$, $C_4F_8$ or $C_4F_6$), a SOC or carbon-based patterning film may be etched using $N_2/H_2$ or $O_2$ based etching chemistries (e.g. $O_2$, $CO_2$, $SO_2$ optionally supplemented with HBr or $CH_4$).

Figure 6:
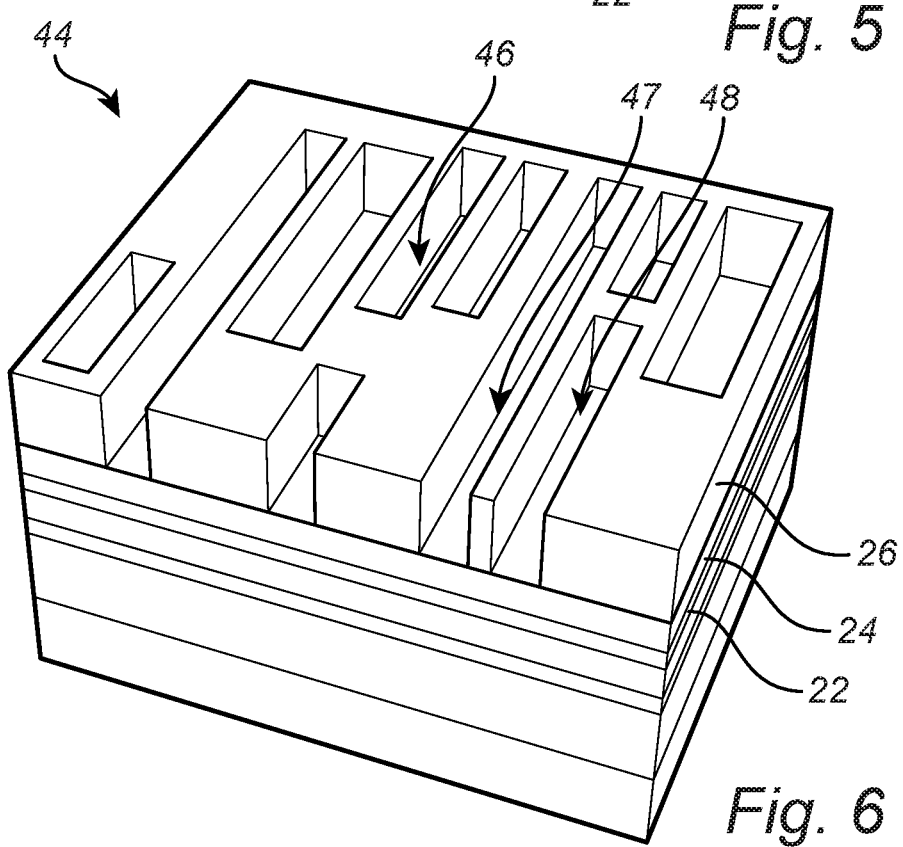
FIG. 6 illustrates a process step of a patterning method, according to an example embodiment.

In FIG. 6, a set of upper trenches, commonly referenced 44, have been patterned in the upper memorization layer 26. The set of upper trenches 44 comprises for instance trenches 46, 47 and 48. The set of upper trenches 44 extend in parallel to each other. The patterning may comprise etching the upper memorization layer 26 using the first mask layer as an etch mask. The pattern comprising the set of trenches 40 in first mask layer 31 have accordingly been memorized in the upper memorization layer 26. A conventional etching process, such as a dry etching process, compatible with the materials forming the first mask layer 31 and the upper memorization layer 26 may be used. For instance, an a-Si layer may be etched through an carbon-based etch mask using $Cl_2$ or fluorine-based etching chemistries such as $SF_6$.

As an alternative to the afore-mentioned trimming step, a trimming step may be applied to upper memorization layer 26 subsequent to patterning the upper trenches 44 therein. The trimming may comprise oxidizing the upper memorization layer 26 to form an oxide layer covering the upper memorization layer 26 and thereafter removing the oxide layer from the upper memorization layer 26 in an etch step, for instance using dHF. This technique may be applied provided the upper memorization layer 26 is formed of a material which may be oxidized in a controlled manner, for instance a-Si.

Figure 7:
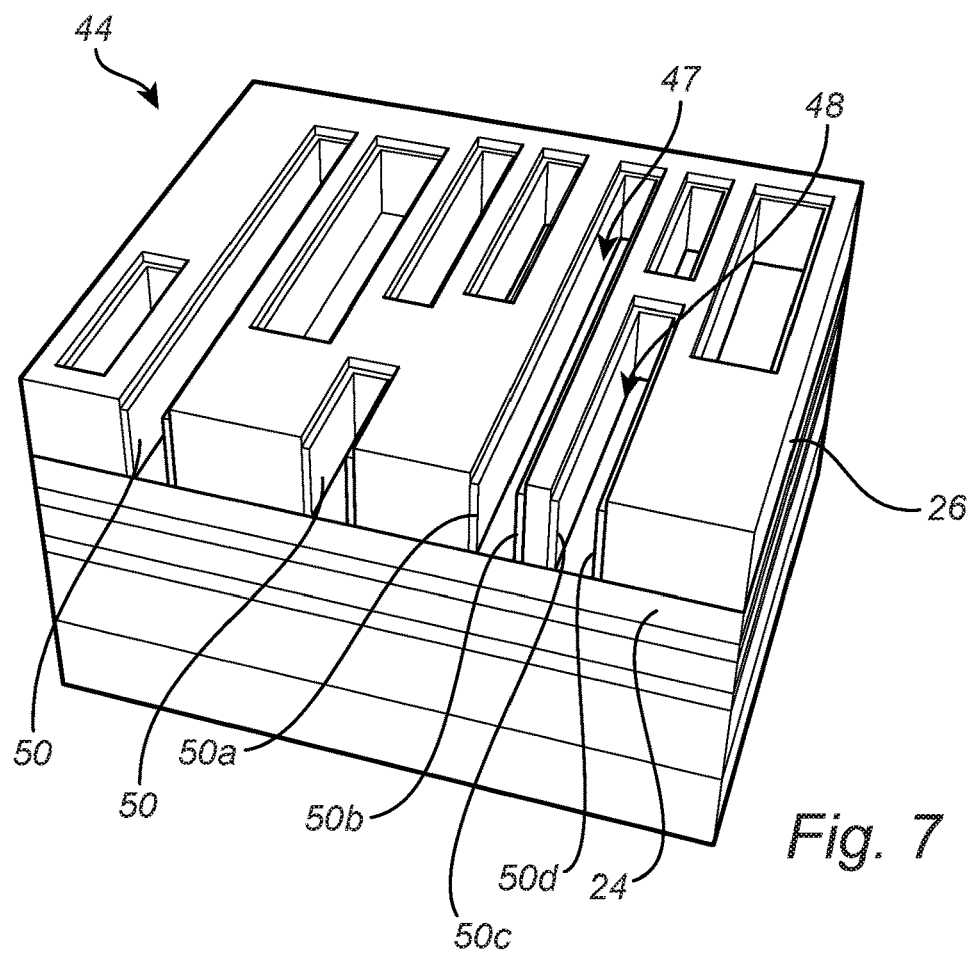
FIG. 7 illustrates a process step of a patterning method, according to an example embodiment.

In FIG. 7 a spacer layer has been formed on sidewalls of the upper trenches. The spacer layer 50 may be an oxide layer, such as silicon oxide $SiO_2$ or a metal oxide layer such as titanium oxide TiOx. A SiN layer may also be used provided SiN is not used to form the lower memorization layer 24. More generally, the spacer layer 50 may be formed of a fourth material different from each one of the first through third materials forming the target layer 22, the lower memorization layer 24 and the upper memorization layer 26.

The spacer layer 50 may be formed by depositing a conformal spacer layer covering the patterned upper memorization layer 26, for instance in an atomic layer deposition (ALD) process. A vertical anisotropic etch may then be performed such that portions of the conformally deposited spacer layer on horizontally oriented surfaces are removed, while portions deposited on the vertically oriented sidewalls of the upper trenches 44 are preserved to form the final spacer layer 50. As shown in FIG. 7, the spacer layer 50 thus defines a pair of spacer lines extending along each upper trench 44, such as spacer lines 50a, 50b along the upper trench 47 and spacer lines 50c, 50d along the upper trench 48. As shown in FIG. 7, the spacer layer 50 may also form on end walls of the trenches 44. The end wall portions layer 50 accordingly connect the spacer lines 50a, 50b and 50c, 50d formed on the mutually opposite trench sidewalls.

Figure 8:
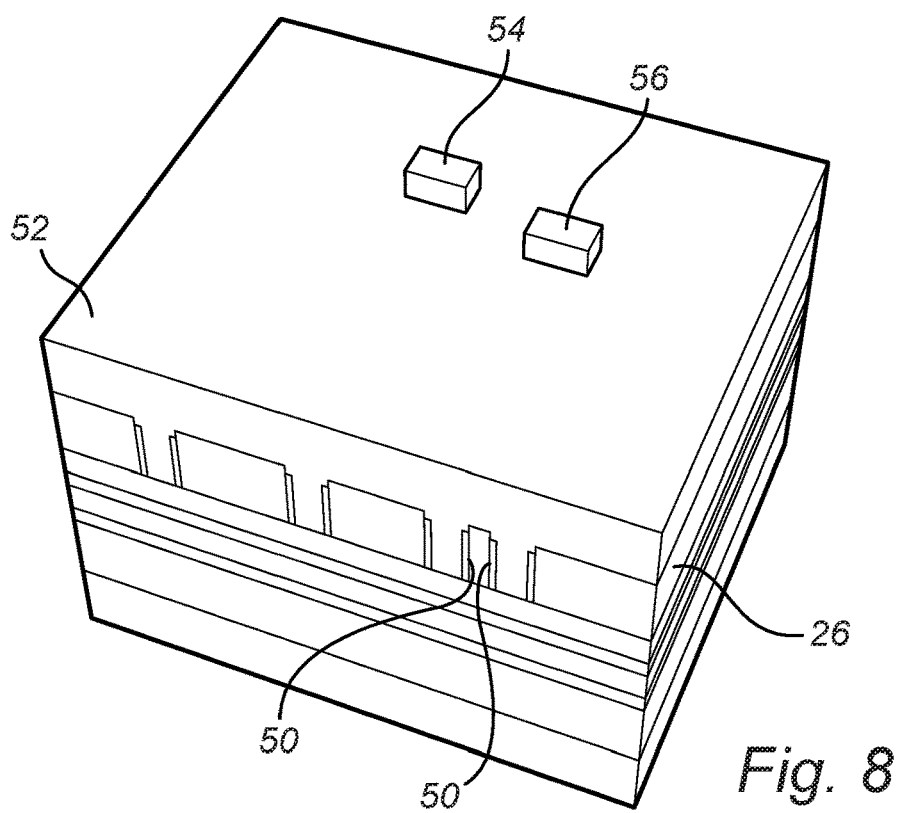
FIG. 8 illustrates the forming of a first block pattern above a lower memorization layer, according to an example embodiment.
Figure 9:
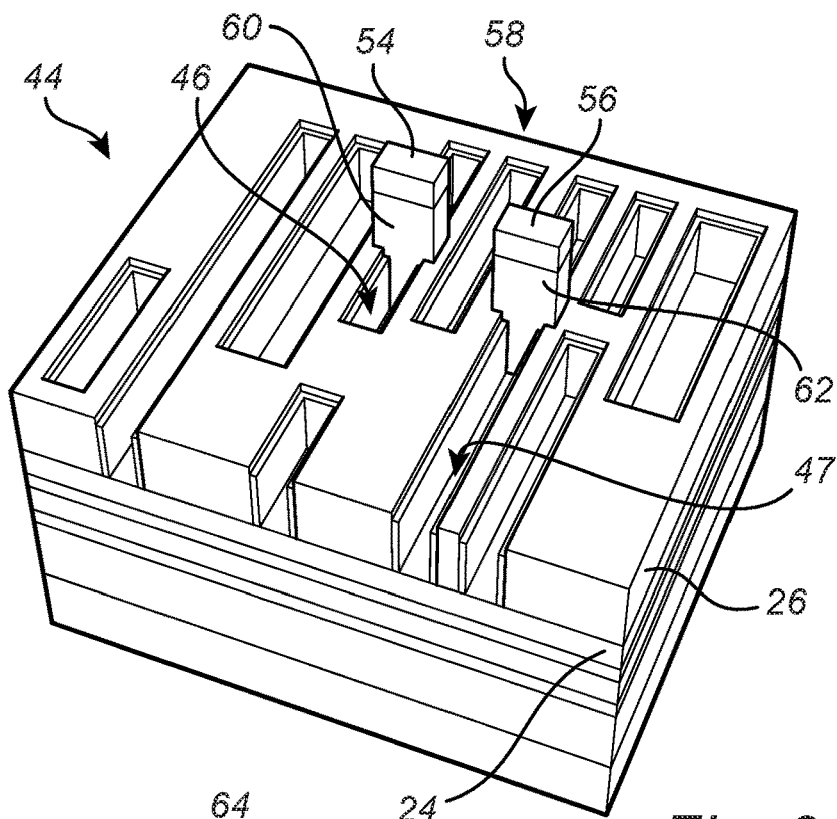
FIG. 9 illustrates the forming of a first block pattern above a lower memorization layer, according to an example embodiment.

FIG. 8-9 illustrate forming of a first block pattern 58 above the lower memorization layer 24. The first block pattern 58 comprises a set of first blocks 60, 62. Each first block 60, 62 extends across an upper trench 46, 48 in the upper memorization layer 26.

In FIG. 8 a first block mask layer 52 has been formed to cover the patterned upper memorization layer 26. The first block mask layer 52 may be formed by a SOC layer or some other organic spin-on layer. A photoresist layer has been formed above the first block mask layer 52 and lithographically patterned to define a photoresist block mask comprising a set of resist blocks 54, 56. Each resist block 54, 56 extends across an upper trench 46, 47 in the upper memorization layer 26 (c.f. FIG. 7).

In FIG. 9, the first block mask layer 52 has been patterned to form the first block pattern 58. The patterning may comprise etching the first block mask layer 52 using the photoresist block mask 54, 56 as an etch mask. Accordingly, a set of first blocks 60, 62 may be patterned in the first block mask layer 52. Following pattering of the first block mask layer 52, the resist blocks 54, 56 may be stripped from the first blocks 60, 62. Similar to the patterning of the first mask layer 31, the patterning of the first block mask layer 52 may comprise a number of transfer steps into one or more transfer layers intermediate the layers 52 and the photoresist layer (such as anti-reflective coating(s) of SOG and/or SiOC or another silicon-including layer).

Figure 10:
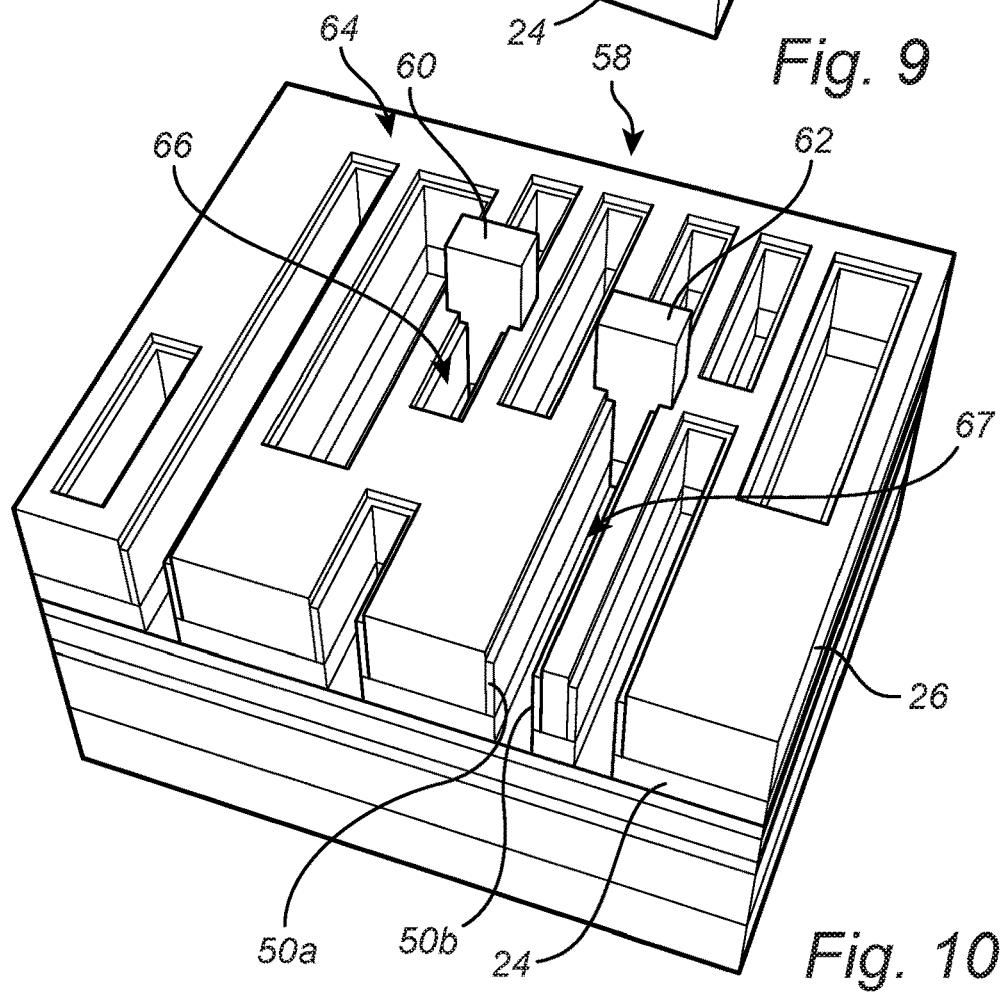
FIG. 10 illustrates a process step of a patterning method, according to an example embodiment.

In FIG. 10 a first set of lower trenches, commonly referenced 64, have been patterned in the lower memorization layer 24 and comprising for instance trenches 66, 67, 68. The patterning may comprise etching the lower memorization layer 24 while using the patterned upper memorization layer 26, the spacer layer 50 and the first block pattern 58 as an etch mask. The first lower trenches 64 exposes an upper surface of the target layer 22. An etching process, such as a dry etching process, allowing etching of the lower memorization layer 24 selectively to the first blocks 60, 62, the spacer layer 50 and the upper memorization layer 26 may be used. For instance, a SiN layer may be etched selectively to SOC, a-Si and an oxide such as a silicon or metal oxide (e.g. $SiO_2$ or $TiO_x$) using fluorine-based etching chemistries.

Figure 11:
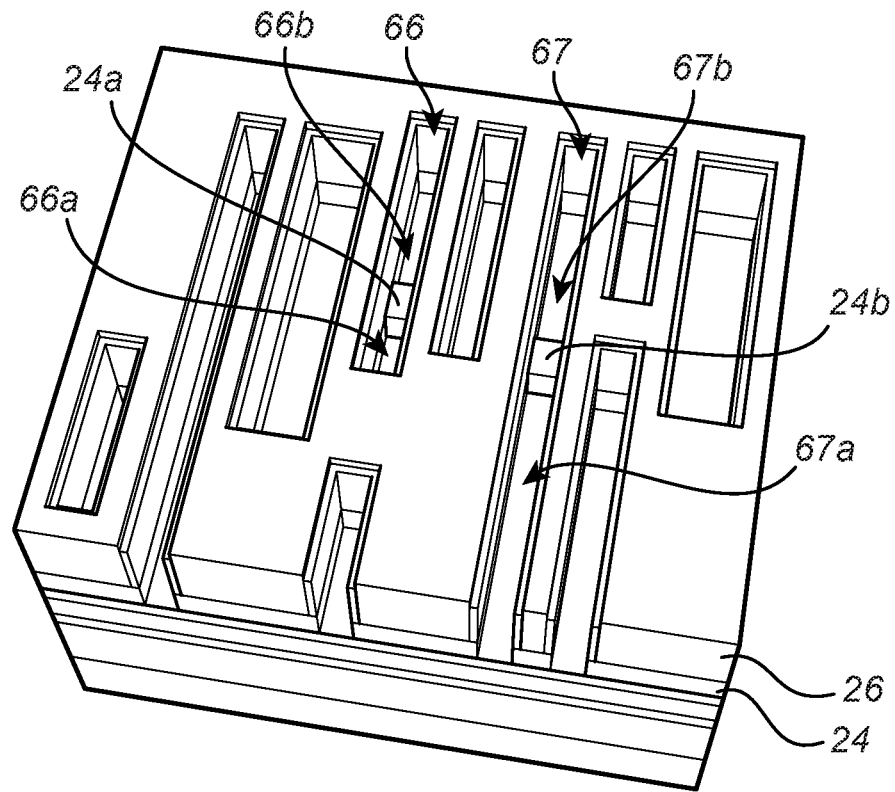
FIG. 11 illustrates a process step of a patterning method, according to an example embodiment.

As is more clearly visible in FIG. 11, where the first blocks 60, 62 have been removed, at least a subset of the lower trenches 64, such as first lower trenches 66, 67 are interrupted by a respective trench interruption. The trench interruptions are formed by the portions 24a, 24b of the lower memorization layer 24 preserved under the first blocks 60, 62. Accordingly the trench 66 forms an interrupted or discontinuous trench formed by two trench portions 66a, 66b. Correspondingly, the trench 67 forms an interrupted or discontinuous trench formed by two trench portions 67a, 67b. As may be seen from FIG. 11, interrupted trenches with more relaxed tip-to-tip separation may be formed without relying on a block-based technique, i.e. by being directly lithographically defined and etched into the first mask layer 31.

Figure 12:
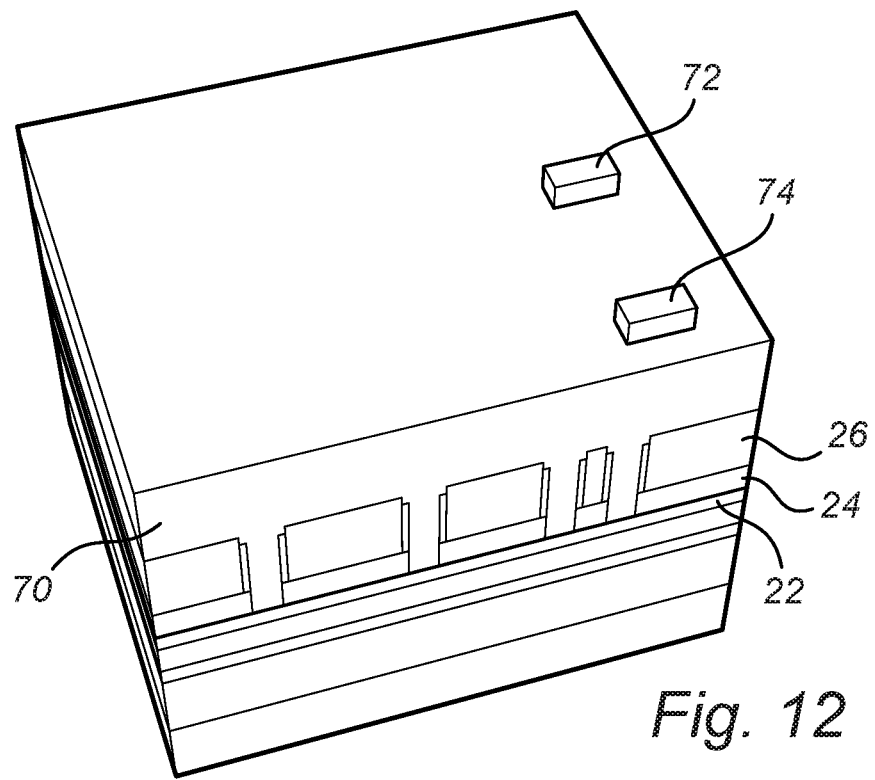
FIG. 12 illustrates the forming of a second block pattern above the patterned lower memorization layer, according to an example embodiment.
Figure 13:
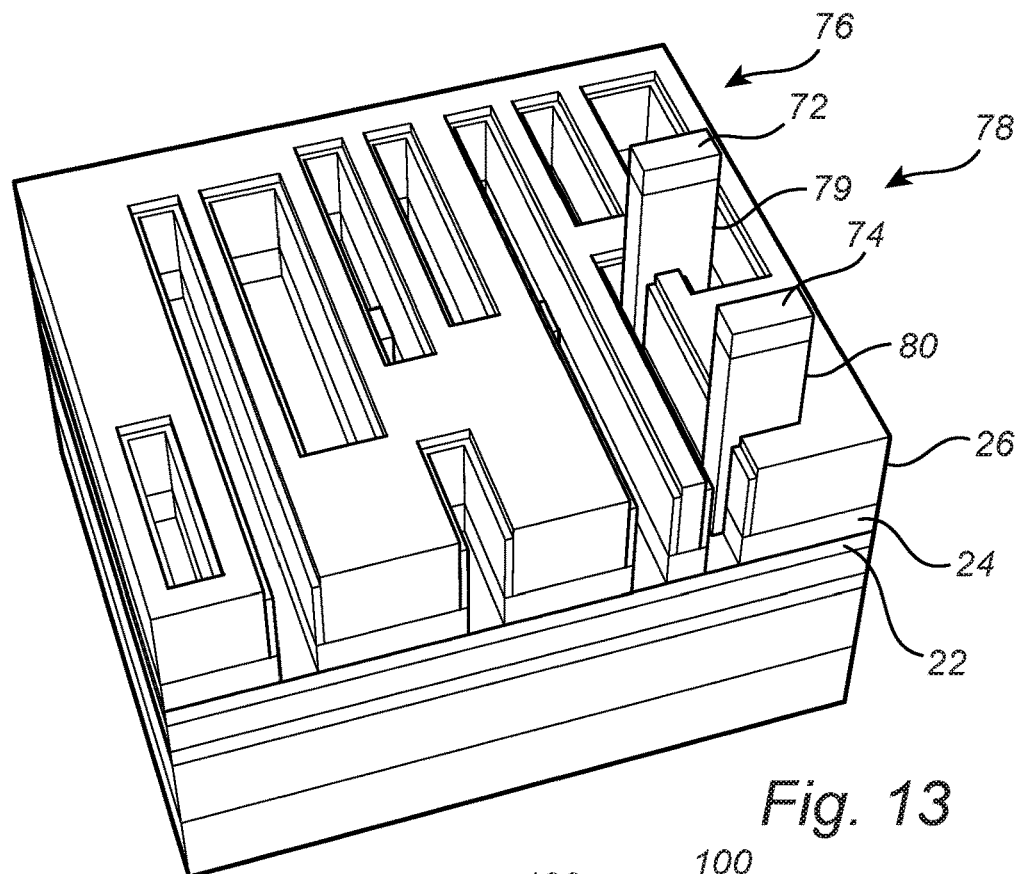
FIG. 13 illustrates the forming of a second block pattern above the patterned lower memorization layer, according to an example embodiment.
Figure 14:
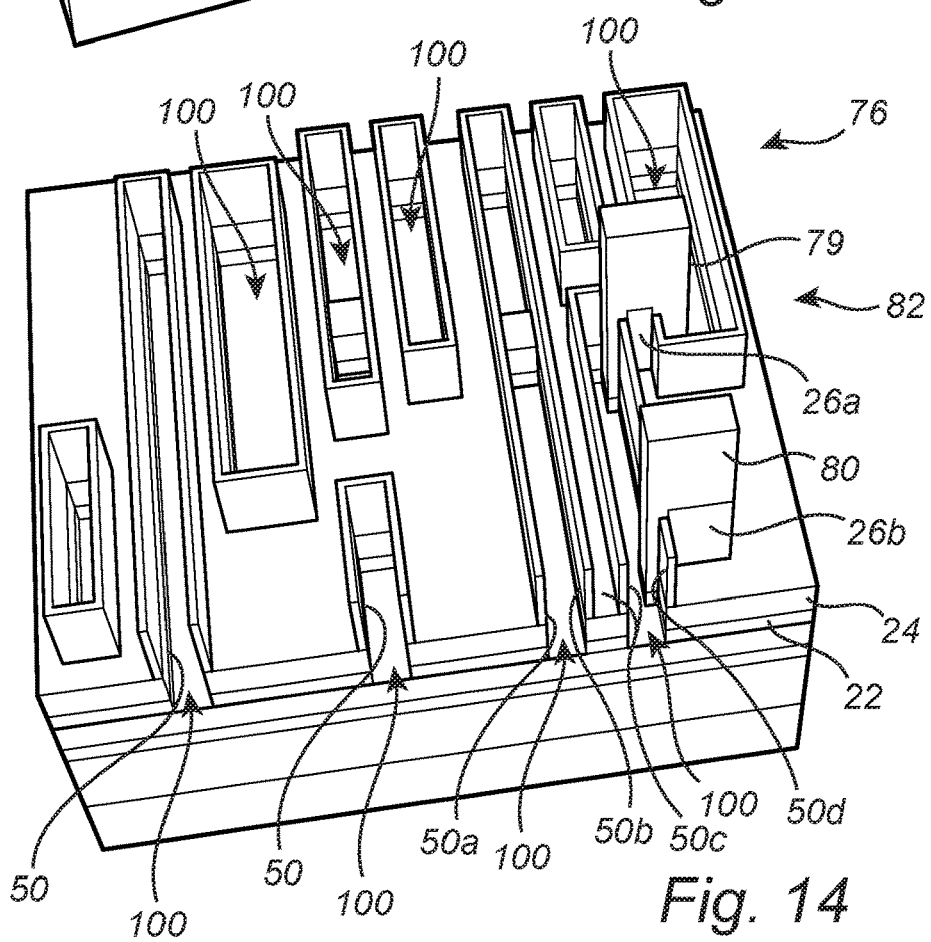
FIG. 14 illustrates the forming of a second block pattern above the patterned lower memorization layer, according to an example embodiment.

FIG. 12-14 illustrate forming of a second block pattern 82 above the (once) patterned lower memorization layer 24. The second block pattern 82 is formed by again patterning the (already once patterned) upper memorization layer 26. As may be seen in FIG. 14 the second block pattern 82 comprises a set of second blocks 26a, 26b, each second block being formed by a respective portion 26a, 26b of the upper memorization layer 26 remaining after the second block patterning.

In FIG. 12, a second block mask layer 70 has been formed to cover the patterned lower and upper memorization layers 24, 26. The second block mask layer 70 fills the first set of lower trenches 64 in the lower memorization layer 24 and the upper trenches 44 in the upper memorization layer 26. The second block mask layer 70 may be formed by a SOC layer or some other organic spin-on layer. A photoresist layer has been formed above the second block mask layer 70 and lithographically patterned to define a photoresist block mask comprising a set of resist blocks 72, 74. Each resist block 72, 74 is formed over a respective portion 26a, 26b of the upper memorization layer 26.

In FIG. 13, the second block mask layer 70 has been patterned to form a second block mask 78. The second block mask 78 comprises a set of second mask blocks 79, 80. The patterning may comprise etching the second block layer 70 using the photoresist block mask 72, 74 as an etch mask. The etching may be stopped when the upper surface of the target layer 22 is exposed in the lower trenches 64. Accordingly, following the patterning of the second block mask layer 70, the upper surface of the target layer 22 is again exposed in the lower trenches 64 in the lower memorization layer. The patterning of the second block mask layer 70 may proceed in a similar fashion as the above described patterning of the first block mask layer 52.

In FIG. 14, the (once patterned) upper memorization layer 26 has been patterned to form the second block pattern 82. The patterning may comprise etching the remaining portions of the upper memorization layer 26 using the second block mask 78 as an etch mask. The second block pattern 82 is formed by the portions 26a, 26b of the upper memorization layer 26 preserved under the second mask blocks 79, 78. Following pattering of the second block mask layer 70, the resist blocks 79, 78 may be stripped from the second blocks 26a, 26b. The upper memorization layer 26 may be etched using any of the etching chemistries discussed in connection with the first patterning of the upper memorization layer 26.

Still with reference to FIG. 14, a first set of target trenches, commonly referenced 100, have been patterned in the target layer 22 under the first set of lower trenches 64. The first set of lower trenches 64 exposes an upper surfaces of an underlying layer, i.e. in the illustrated process flow formed by an upper surface of the dielectric layer stack 10. The first set of target trenches 100 correspond to the first set of lower trenches 64. The first set of target trenches 100 extend in parallel to each other. The first set of target trenches 100 comprises for instance first target trenches 102 and 104. As may be more clearly seen in FIG. 15, the first target trench 102 is formed by two trench portions 102a, and 102b interrupted by a trench interruption formed by a portion of the target layer 22 preserved under the portion 24b of the lower memorization layer 24.

The patterning of the first set of target trenches 100 may comprise etching the target layer 22 through the first set of lower trenches 64 in the lower memorization layer 26. Accordingly, the (once) patterned lower memorization layer 26 and the spacer layer 50 may be used as a combined etch mask during the patterning of the target layer 22. The etching may be tuned such that the second block mask 78 and/or at least the second block pattern 82 are at least partially preserved following formation of the first set of target trenches 100. Depending on the materials of the target layer 22 and the upper memorization layer 26, and the etching chemistry used during the second patterning of the upper memorization layer 26, the first set of target trenches 100 and the upper memorization layer 26 may be etched simultaneously, i.e. by the same etching chemistry, and selectively to the spacer layer 50 and the lower memorization layer 24. For instance, a-Si and TiN may be etched simultaneously and selectively to an oxide such as a silicon or metal oxide (e.g. $SiO_2$ or $TiO_x$) and SiN using an $Cl_2$-based etching chemistry.

Figure 15:
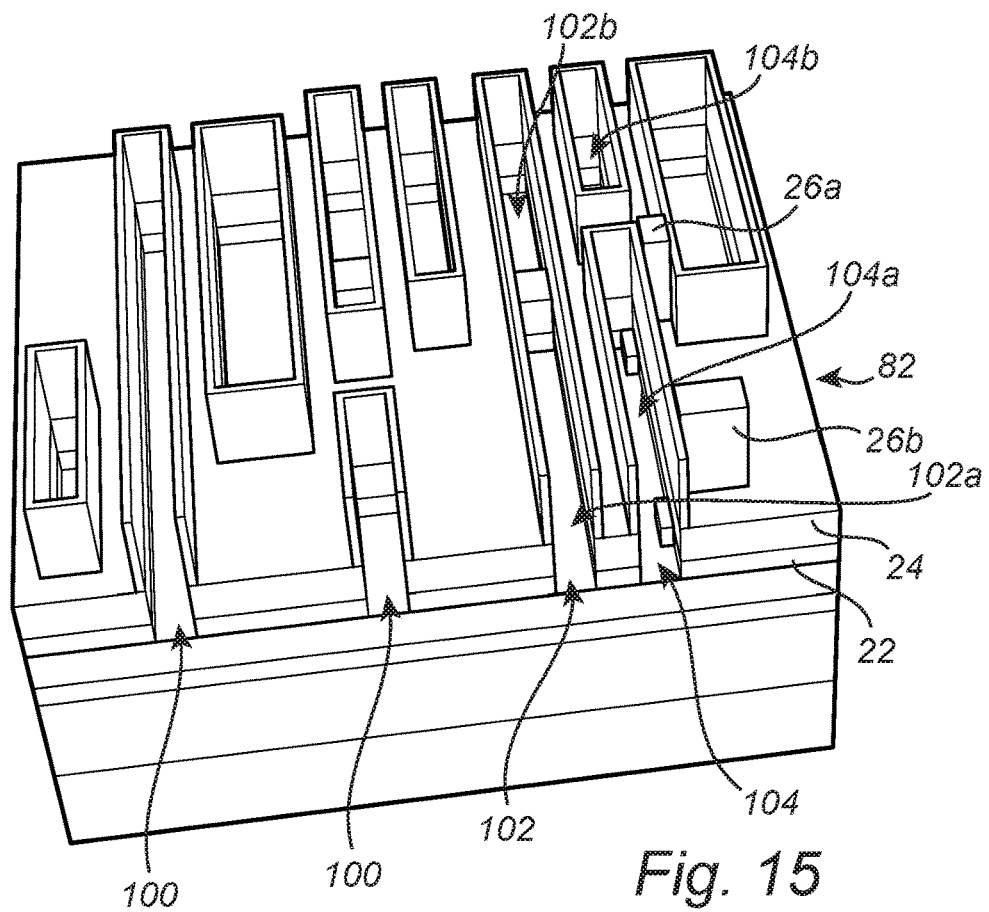
FIG. 15 illustrates a process step of a patterning method, according to an example embodiment.

Following patterning of the first set of target trenches 100 the second block mask 78 (or remaining portions thereof) may be removed from the second block pattern 82 by etching. The resulting structure is shown in FIG. 15.

Figure 16:
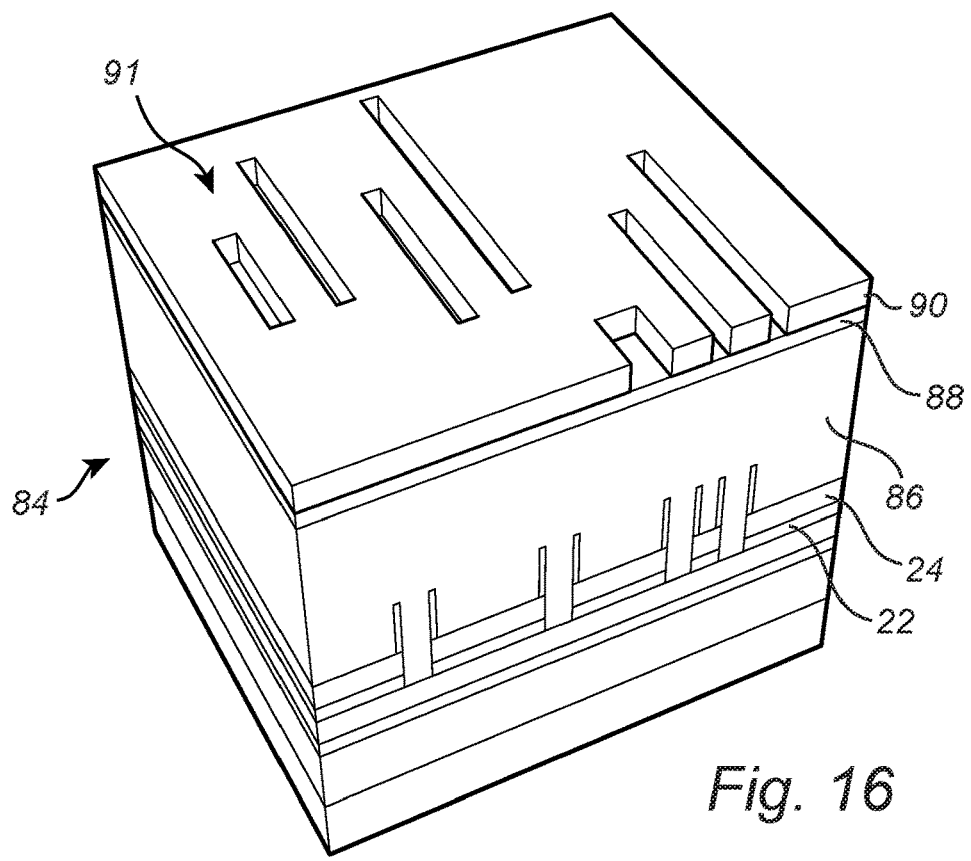
FIG. 16 illustrates a process step for forming a second mask layer and forming a set of trenches therein using lithography and etching, according to an example embodiment.
Figure 17:
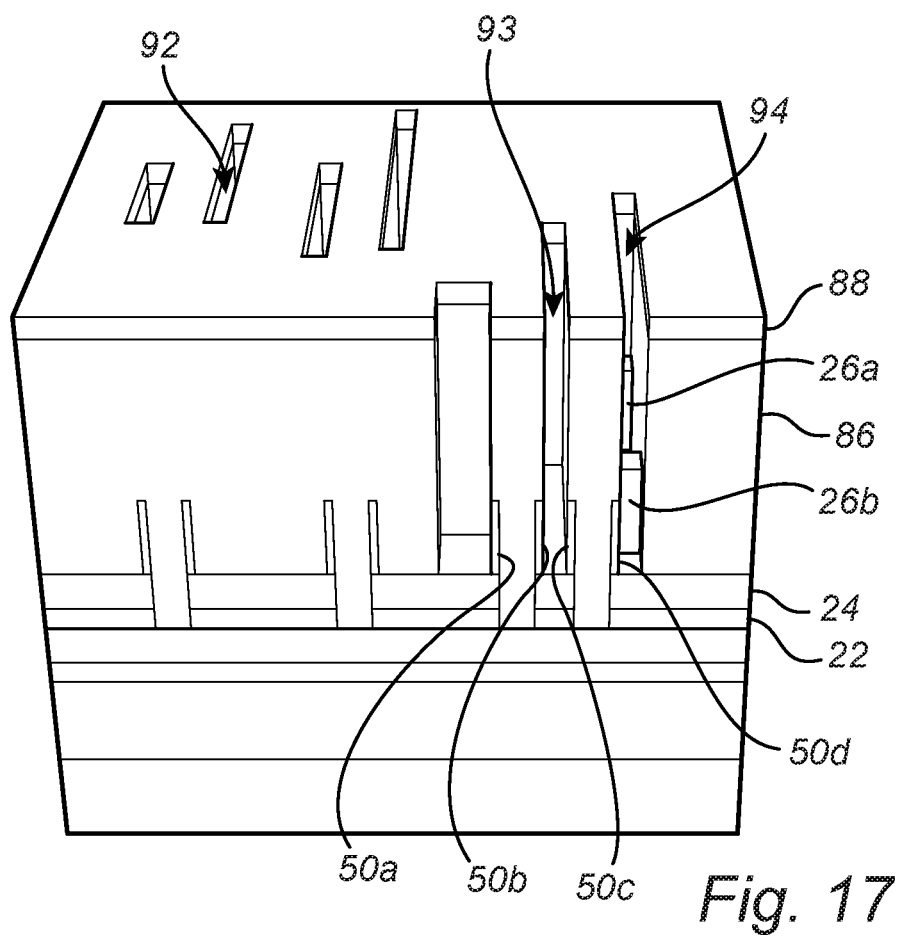
FIG. 17 illustrates a process step for forming a second mask layer and forming a set of trenches therein using lithography and etching, according to an example embodiment.

FIGS. 16-17 illustrate process steps for forming a second mask layer 86 and forming a set of trenches 92 therein using lithography and etching.

In FIG. 16 a second lithographic layer stack 84 has been formed above the patterned lower memorization layer 24 and the second block pattern 82. The lithographic layer stack 84 comprises the second mask layer 86 and a photoresist layer 90. The second mask layer 86 may be formed by a SOC layer or some other organic spin-on-layer. As shown, the layer stack 30 may additionally comprise one or more transfer layers 88 intermediate the second mask layer 86 and the photoresist layer 90, such as an anti-reflective coating, for instance of SOG or SiOC.

A trench pattern comprising a set of trenches 91 have been lithographically patterned in the photoresist layer 90. Each trench of the set of trenches 91 is formed over a respective remaining portion of the (once patterned) lower memorization layer 24. Moreover, each trench of the set of trenches 91 is formed over a region of the target layer 22 where a trench of a second set of target trenches 106 is to be formed. As shown, the trenches 91 may be formed with various widths (along the first horizontal direction X) and various longitudinal dimensions (along the second horizontal direction Y). The trenches 39 may extend in parallel to each other. The trenches 39 may further extend in parallel to the first set of lower trenches 64 already formed in the lower memorization layer 24.

In FIG. 17, the trench pattern comprising the set of trenches 91 have been transferred into the transfer layer 88 and the second mask layer 86 to form a set of trenches 92. The set of trenches 92 comprises for instance trenches 93, 94. The set of trenches 92 exposes an upper surface of the remaining portions of the (once patterned) lower memorization layer 24. At least a subset of the trenches 92, such as trenches 93, 94 may be formed to expose and extend along one or more spacer lines 50b, 50c, 50d. At least a subset of the trenches, such as the trench 94, may be formed to expose one or more second blocks 26a, 26b of the second block pattern 82.

The pattern transfer may comprise first transferring the trench pattern comprising the set of trenches 91 into the transfer layer 88 by etching the layer 88 while using the photoresist layer 90 as an etch mask. The second mask layer 86 may then be etched through the trenches in the transfer layer 88. If the second mask layer 86 is formed by an organic material, the photoresist layer 90 may be consumed during the etching. Thus, mainly the SOG transfer layer 88 may act as an etch mask during the patterning of the second mask layer 86. Optionally, trimming of the trench pattern may be performed, analogous to the trimming of the trenches in the mask layer stack 30.

Figure 18:
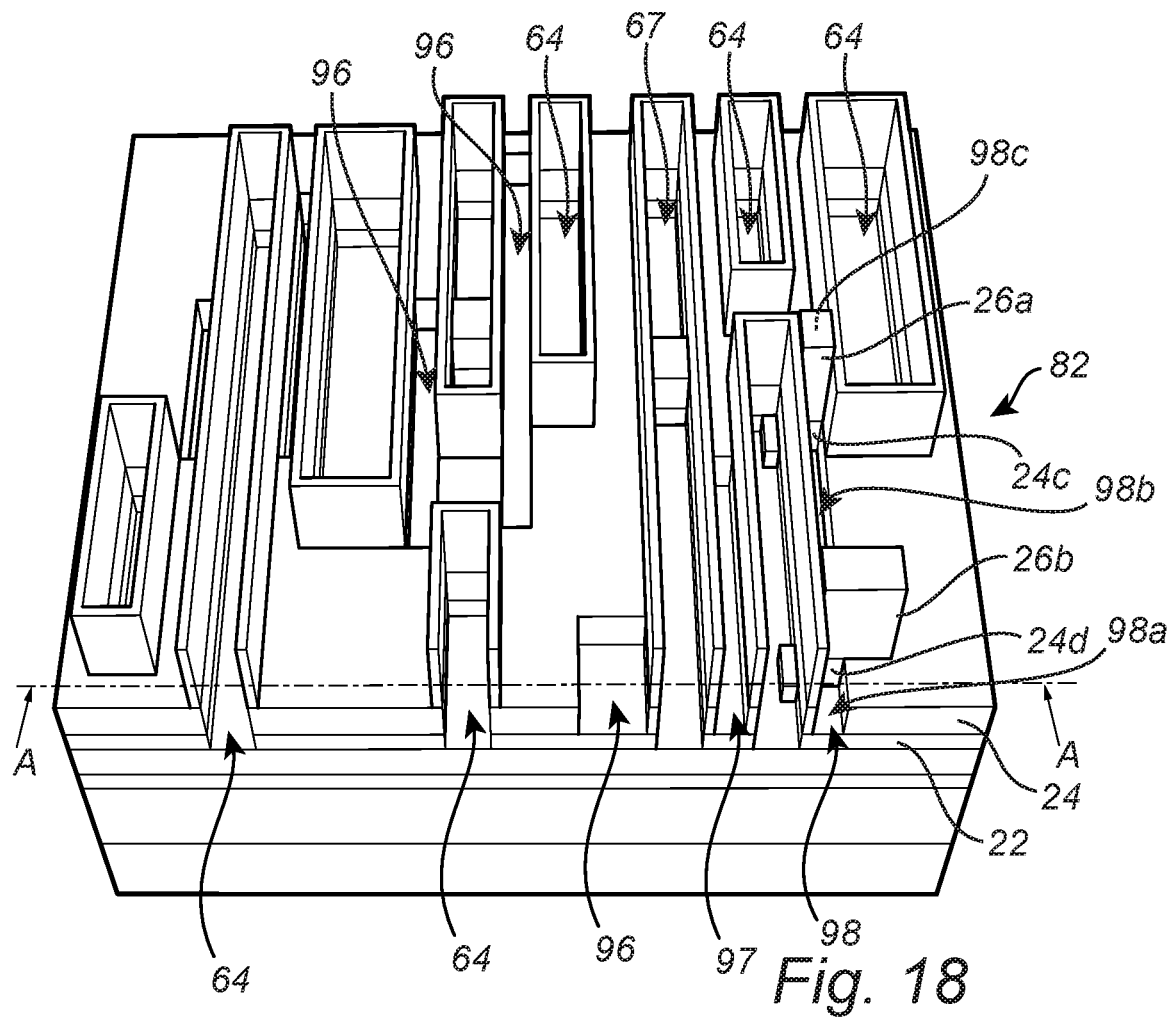
FIG. 18 illustrates a process step of a patterning method, according to an example embodiment.

In FIG. 18, a second set of lower trenches 96 have been patterned in the (once patterned) lower memorization layer 24. The patterning may comprise etching the lower memorization layer 24 using the second mask layer 86, the spacer layer 50 and the second block pattern 82 as an etch mask. The second set of lower trenches 96 exposes an upper surface of the (once patterned) target layer 22. Any of the etching processes mentioned in connection with the patterning of the first set of lower trenches 64 may be used for etching the second set of lower trenches 96.

As is visible in FIG. 18 at least a subset of the second lower trenches 96, such as the second lower trench 98, are interrupted by one or more trench interruptions 24c, 24d, each trench interruption 24c, 24d being formed by a portion 24c, 24d of the lower memorization layer 24 preserved under a respective one of the second blocks 78, 80. Accordingly the trench 98 forms an interrupted or discontinuous trench formed by three trench portions 98a, 98b, 98c.

Figure 19:
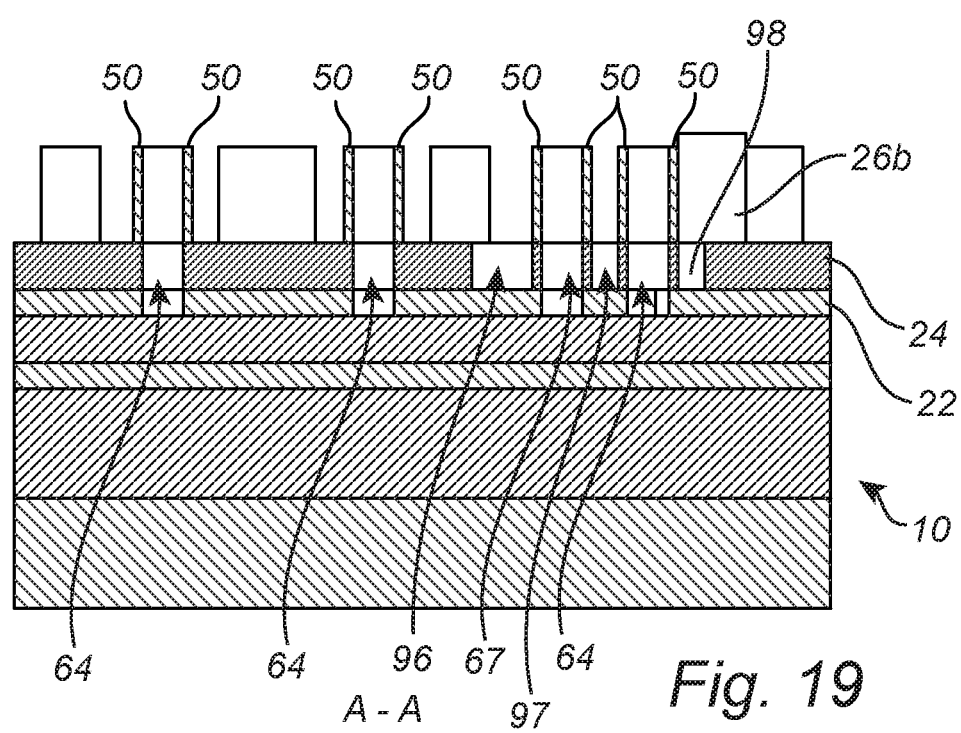
FIG. 19 illustrates an alternate arrangement of the first set of lower trenches and the second set of lower trenches, according to an example embodiment.

FIG. 19 is a plan view along line A-A indicated in FIG. 18, showing more clearly the alternating arrangement of the first set of lower trenches 64 and the second set of lower trenches 96. The trenches 67, 68 of the first set of lower trenches 64 and the trenches 97, 98 of the second set of lower trenches 96 are arranged alternatingly. Each trench of this subset of trenches 67, 68, 97, 98 is separated from a neighboring one of this subset by a distance defined by the thickness of the spacer layer 50.

Figure 20:
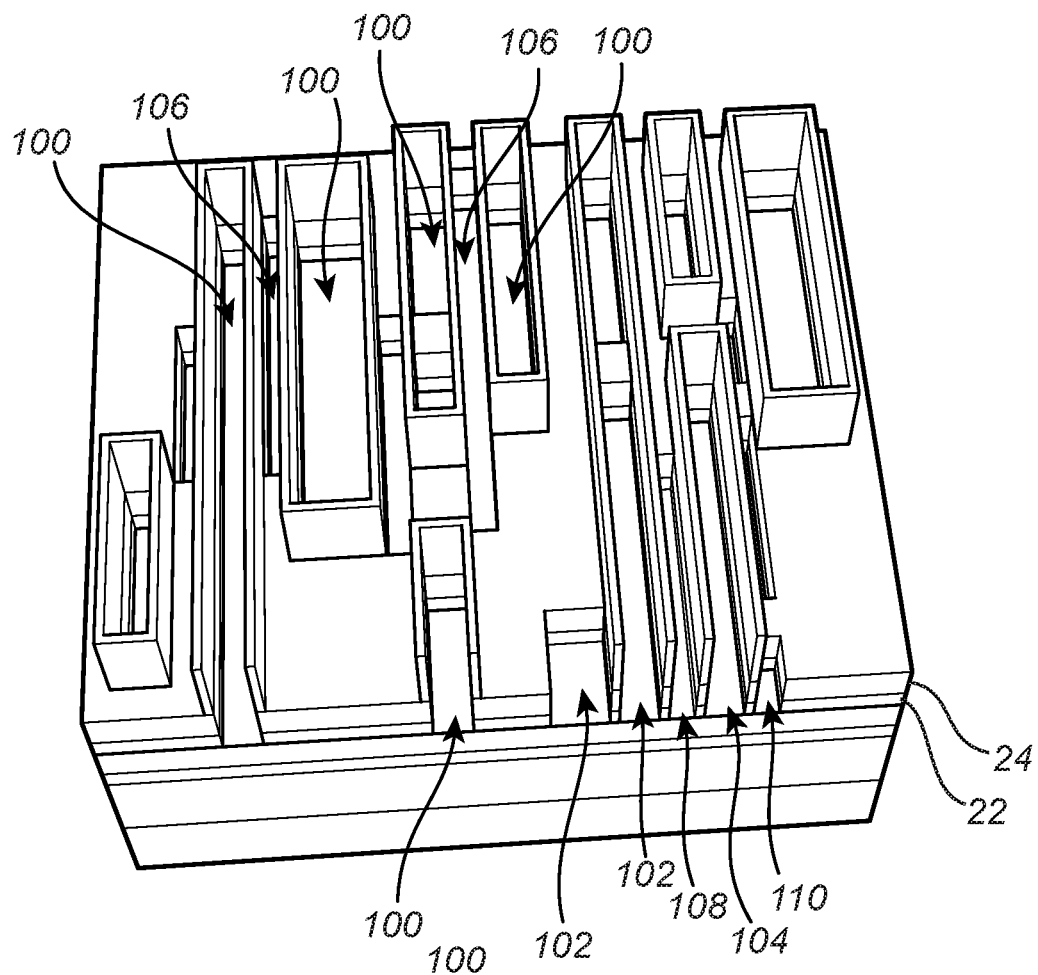
FIG. 20 illustrates a process step of a patterning method, according to an example embodiment.

In FIG. 20 a second set of target trenches 106 have been patterned in the target layer 22 under the second set of lower trenches 96. The second set of target trenches 106 exposes an upper surfaces of the underlying layer, i.e. in the illustrated process flow formed by the upper surface of the dielectric layer stack 10. As may be seen in FIG. 20, the target trenches 102, 104 of the first set 100 and the target trenches 108, 110 of the second set 106 forms a subset of target trenches which are arranged alternatingly. Each trench of this subset of trenches 67, 68, 97, 98 is separated from a neighboring one of this subset by a distance defined by the thickness of the spacer layer 50.

The patterning of the second set of target trenches 106 may comprise etching the target layer 22 through the second set of lower trenches 96 in the lower memorization layer 26. Accordingly, the (twice) patterned lower memorization layer 26 and the spacer layer 50 may be used as a combined etch mask during the second patterning of the target layer 22. Any of the etching processes mentioned in connection with the patterning of the first set of target trenches 100 may be used for etching the second set of target trenches 106.

Figure 21:
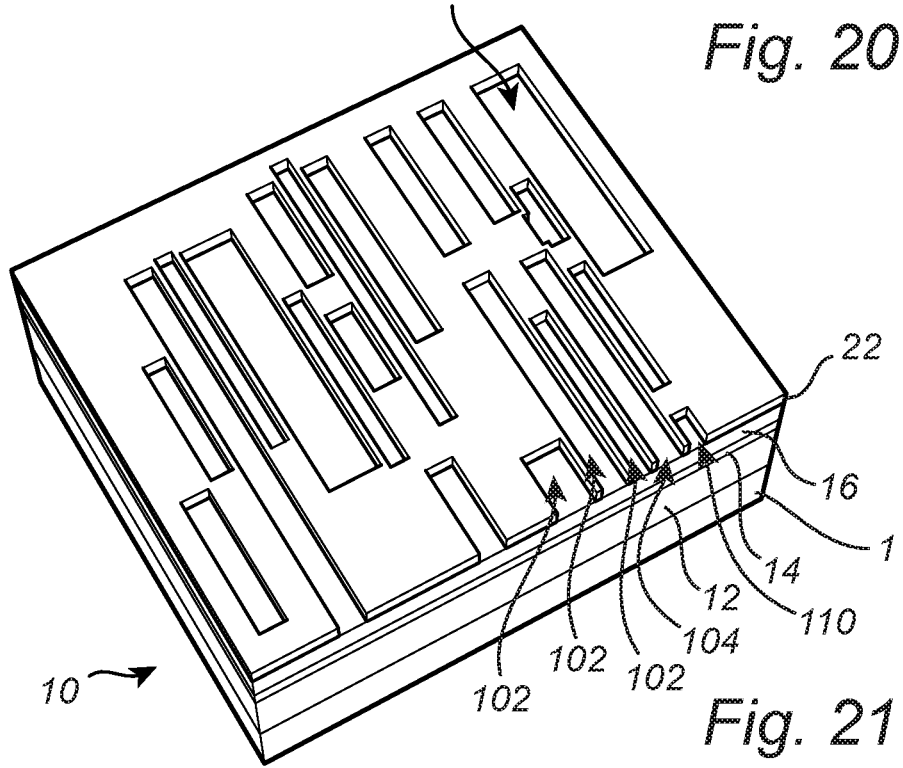
FIG. 21 illustrates a process step of a patterning method, according to an example embodiment.

Following patterning of the second set of target trenches 106 the remaining portions of the lower memorization layer 26 and the spacer layer 50 may be removed from the patterned target layer 22 by etching. The resulting structure is shown in FIG. 21.

The method may then proceed with patterning the dielectric layer stack 10 using the target layer 22 as an etch mask to form a set of trenches in the dielectric layer. The dielectric layer trenches may subsequently be filled with a conductive material to form a pattern of conductive paths of an interconnect structure.

In the above, the disclosure has mainly been described with reference to a limited number of examples. However, as is readily appreciated by a person skilled in the art, other examples than the ones disclosed above are equally possible within the scope of the disclosure, as defined by the appended claims.

Figure 22:
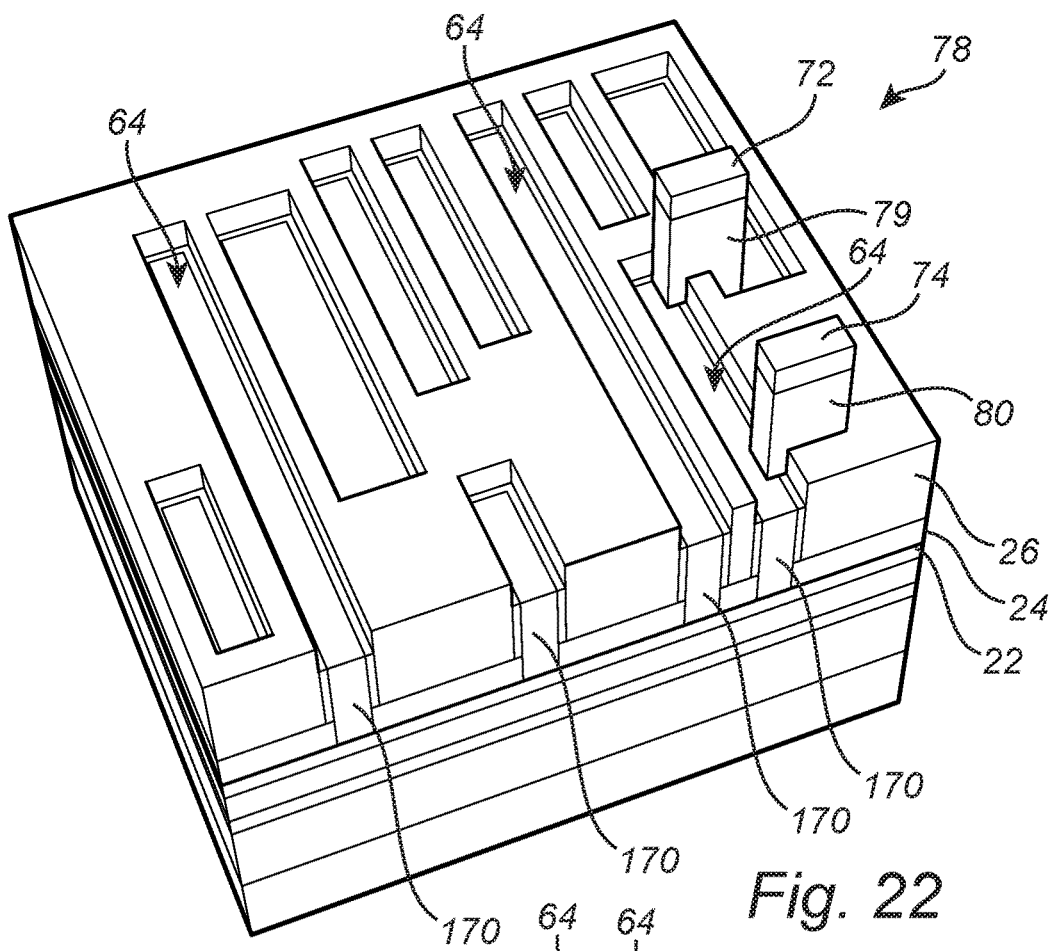
FIG. 22 illustrates a process step of a patterning method, according to an example embodiment.

For instance, according to an alternative process flow, the first and second sets of target trenches 100, 106 in the target layer 22 may instead of being patterned in a sequential approach, be patterned simultaneously:

The alternative process may proceed as disclosed with reference to FIGS. 1-12 above. The second block mask layer 70 has accordingly been formed to cover the patterned lower and upper memorization layers 24, 26 and accordingly fill the first set of lower trenches 64. However, as shown in FIG. 22, the patterning of the second block mask layer 70 may comprises etching the second block mask layer 70 to form the second block mask 78 comprising the set of second mask blocks 79, 80 and such that portions 170 of the second block mask layer 70 remain in the first set of lower trenches 64 of the lower memorization layer 24. The etching of the second block mask layer 70 may be stopped when an upper surface of the patterned upper memorization layer 26 is exposed. A thickness portion of the second block mask layer 70 may accordingly remain also in regions exposed by the resist block mask 72, 74, thereby forming the portions 170 filling the first set of lower trenches 64.

Figure 23:
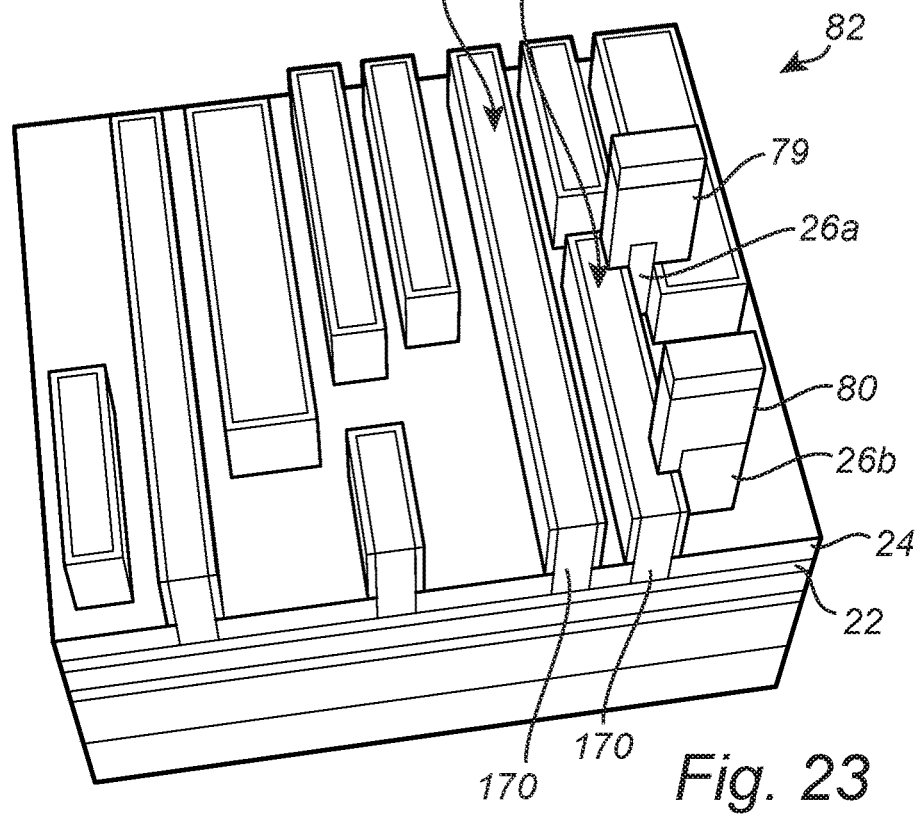
FIG. 23 illustrates a process step of a patterning method, according to an example embodiment.

In FIG. 23 the (once) patterned upper memorization layer 26 has been patterned to form the second block pattern 82 comprising second blocks 26a, 26b. The patterning may, like in FIG. 14, comprise etching the remaining portions of the upper memorization layer 26 using the second block mask 78 as an etch mask. During the patterning, the portions 170 of the second block mask layer 70 remaining in the first set of lower trenches 64 may mask the target layer 22, thus counteracting etching of the target layer 22 through the first set of lower trenches 64.

Figure 24:
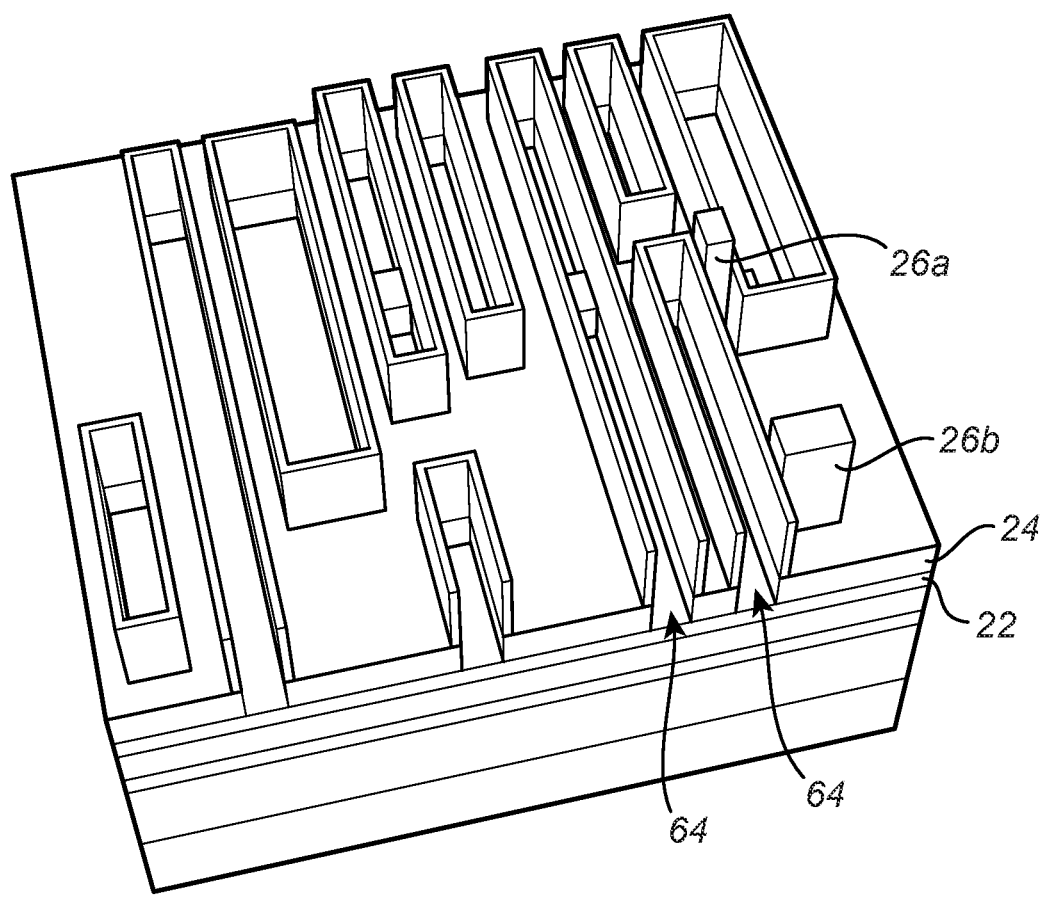
FIG. 24 illustrates a process step of a patterning method, according to an example embodiment.

In FIG. 24, the second block mask 78 and the portions of the second block mask layer 70 have been removed subsequent to forming the second block pattern 82. The target layer 22 is thereby exposed in the first set of lower trenches 64. The process may thereafter proceed in the manner disclosed in connection with FIGS. 16-17 (forming the second mask layer 86 and the set of trenches 92), FIG. 18 (patterning the second set of lower trenches 96 in the lower memorization layer 24). However, instead of thereafter merely patterning the second set of target trenches 102 in the target layer 22, the first and second set of target trenches 100, 106 may be patterned simultaneously in the target layer 22 by etching the target layer 22 and using the (twice) patterned lower memorization layer 24 as an etch mask. Following patterning of the first and second sets of target trenches 100, 102 the remaining portions of the lower memorization layer 26 and the spacer layer 50 may be removed from the patterned target layer 22 by etching to arrive at the resulting structure shown in FIG. 21.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A patterning method comprising:
    forming a layer stack comprising in a bottom-up direction a target layer, a lower memorization layer and an upper memorization layer,
    forming above the upper memorization layer a first mask layer, wherein a set of trenches are formed in the first mask layer using lithography and etching,
    patterning a set of upper trenches in the upper memorization layer, the patterning comprising using the first mask layer as an etch mask,
    forming a spacer layer on sidewalls of the set of upper trenches,
    forming a first block pattern, the first block pattern comprising a set of first blocks, each first block extending across an upper trench in the upper memorization layer,
    patterning a first set of lower trenches in the lower memorization layer, the patterning comprising using the patterned upper memorization layer, the spacer layer and the first block pattern as an etch mask, wherein at least a subset of the first set of lower trenches are interrupted by a trench interruption, each trench interruption being formed by a portion of the lower memorization layer preserved under a respective one of the first blocks,
    patterning the patterned upper memorization layer to form a second block pattern comprising a set of second blocks, each second block being formed of a respective remaining portion of the upper memorization layer,
    forming above the patterned lower memorization layer and the second block pattern a second mask layer, wherein a set of trenches are formed in the second mask layer using lithography and etching, wherein each trench of the set of trenches is formed over a respective remaining portion of the patterned lower memorization layer,
    patterning a second set of lower trenches in the patterned lower memorization layer, the patterning comprising using the second mask layer, the spacer layer and the second block pattern as an etch mask, wherein at least a subset of the second set of lower trenches are interrupted by a trench interruption, each trench interruption being formed by a portion of the lower memorization layer preserved under a respective one of the second blocks, and
    wherein the method further comprises patterning in the target layer a first set of target trenches under the first set of lower trenches and a second set of target trenches under the second set of lower trenches.

2. The method according to claim 1, wherein patterning of the first set of target trenches is performed prior to patterning of the second set of target trenches, the patterning of the first set of target trenches comprising using the once patterned lower memorization layer and the spacer layer as an etch mask, and the patterning of the second set of target trenches comprising using the twice patterned lower memorization layer as an etch mask.

3. The method according to claim 1, wherein the first set of target trenches are formed during the patterning of the second block pattern in the once patterned upper memorization layer and prior to forming the second mask layer.

4. The method according to claim 1, wherein trenches of at least a subset of the second set of lower trenches are arranged alternatingly with trenches of at least a subset of the first set of lower trenches.

5. The method according to claim 4, wherein the spacer layer defines first and second spacer lines along each upper trench, and wherein each trench of the at least a subset of the second set of lower trenches is spaced from an adjacent trench of the at least a subset of the first set of lower trenches by a thickness portion of the lower memorization layer preserved under a respective one of the first and second spacer lines.

6. The method according to claim 1, wherein forming the set of trenches in the first mask layer comprises:
    forming a photoresist layer above the first mask layer and lithographically patterning a set of trenches in the photoresist layer, and
    patterning the set of trenches in the first mask layer, the patterning comprising using the patterned photoresist layer as an etch mask.

7. The method according to claim 6, wherein a transfer layer is formed above the first mask layer, wherein the photoresist layer is formed above the transfer layer, and wherein the patterning the set of trenches in the first mask layer comprises:
    transferring the set of trenches in the photoresist layer into the transfer layer by etching, thereby forming a set of trenches in the transfer layer,
    subjecting the patterned transfer layer to an etch step thereby forming a trimmed trench pattern in the transfer layer, and
    thereafter transferring the trimmed trench pattern into the first mask layer by etching, thereby forming the set of trenches in the first mask layer.

8. The method according to claim 1, wherein the second mask layer is formed to cover the patterned lower memorization layer and the second block pattern, and wherein forming the set of trenches in the second mask layer comprises:
    forming a photoresist layer above the second mask layer and lithographically patterning a set of trenches in the photoresist layer, and
    patterning the set of trenches in the second mask layer, the patterning comprising using the patterned photoresist layer as an etch mask.

9. The method according to claim 8, wherein a transfer layer is formed above the second mask layer, wherein the photoresist layer is formed above the transfer layer, and wherein the patterning the set of trenches in the second mask layer comprises:
    transferring the set of trenches in the photoresist layer into the transfer layer by etching, thereby forming a set of trenches in the transfer layer, and
    thereafter transferring the set of trenches in the transfer layer into the second mask layer by etching, thereby forming the set of trenches in the second mask layer.

10. The method according to claim 1, wherein forming the first block pattern comprises:
    forming a first block mask layer covering the patterned upper memorization layer,
    forming a photoresist layer above the first block mask layer and lithographically patterning the photoresist layer to define a photoresist block mask comprising a set of resist blocks, each resist block extending across an upper trench in the upper memorization layer, and
    patterning the first block mask layer to form the second block pattern, the patterning comprising using the photoresist block mask as an etch mask.

11. The method according to claim 1, wherein patterning the patterned upper memorization layer to form a second block pattern comprises:
    forming a second block mask layer covering the patterned lower memorization layer and the patterned upper memorization layer,
    forming a photoresist layer above the second block mask layer and lithographically patterning the photoresist layer to define a photoresist block mask comprising a set of resist blocks, each resist block being formed over a respective remaining portion of the upper memorization layer,
    patterning the second block mask layer to form a second block mask comprising a set of second mask blocks, the patterning comprising using the photoresist block mask as an etch mask, and
    patterning the patterned upper memorization layer to form the second block pattern, the patterning comprising using the second block mask as an etch mask.

12. The method according to claim 11, wherein the patterning of the second block mask layer comprises etching the second block mask layer to form the second block mask comprising the set of second mask blocks and such that portions of the second block mask layer remain in the first set of lower trenches, wherein during the patterning of the patterned upper memorization layer to form the second block pattern, the portions of the second block mask layer remaining in the first set of lower trenches masks the target layer within the first set of lower trenches, and wherein the method further comprises:
    removing the second block mask and the portions of the second block mask layer subsequent to forming the second block pattern.

13. The method according to claim 1, wherein the target layer is a hard mask layer.

14. The method according to claim 13, further comprising transferring the first set of target trenches and the second set of target trenches into an underlying layer using the target layer as an etch mask.

15. The method according to claim 14, wherein the underlying layer is a dielectric layer.

* * * * *